United States Patent
Yamashita et al.

(10) Patent No.: US 10,467,955 B2
(45) Date of Patent: *Nov. 5, 2019

(54) ELECTROLUMINESCENT DISPLAY PANEL AND ELECTRONIC APPARATUS

(71) Applicant: Sony Corporation, Tokyo (JP)

(72) Inventors: Junichi Yamashita, Tokyo (JP); Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,092

(22) Filed: Jan. 21, 2019

(65) Prior Publication Data

US 2019/0172389 A1     Jun. 6, 2019

Related U.S. Application Data

(63) Continuation of application No. 14/640,167, filed on Mar. 6, 2015, now Pat. No. 10,217,405, which is a (Continued)

(30) Foreign Application Priority Data

Jan. 21, 2008 (JP) ................. 2008-011004

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *G09G 3/3258* (2013.01);
(Continued)

(58) Field of Classification Search
CPC ... G09G 2300/0417; G09G 2300/0426; G09G 2300/043; G09G 2300/0819;
(Continued)

(56) References Cited

U.S. PATENT DOCUMENTS 5,796,150 A     8/1998   Wuu et al.
6,489,952 B1   12/2002   Tanaka et al.
(Continued)

FOREIGN PATENT DOCUMENTS

JP     2000-172199 A     6/2000
JP     2000-284723 A    10/2000
(Continued)

OTHER PUBLICATIONS

Japanese Office Action dated Dec. 1, 2009 for corresponding Japanese Application No. 2008-011004.
(Continued)

*Primary Examiner* — Hong Zhou
(74) *Attorney, Agent, or Firm* — Michael Best & Friedrich LLP

(57) ABSTRACT

An electroluminescent display panel has pixel circuits for an active matrix driving system. At least one of the pixel circuits has a thin-film transistor in which a portion of a pattern of a metal wiring material above a channel layer of the thin-film transistor is disposed to shield the channel region of the thin-film transistor.

2 Claims, 29 Drawing Sheets

Related U.S. Application Data continuation of application No. 14/155,805, filed on Jan. 15, 2014, now Pat. No. 9,001,011, which is a continuation of application No. 13/909,382, filed on Jun. 4, 2013, now Pat. No. 8,633,875, which is a continuation of application No. 12/314,648, filed on Dec. 15, 2008, now Pat. No. 8,698,707.

(51) Int. Cl.
  *G09G 3/3258* (2016.01)
  *H01L 27/32* (2006.01)

(52) U.S. Cl.
  CPC ... *H01L 27/3272* (2013.01); *G09G 2300/043* (2013.01); *G09G 2300/0417* (2013.01); *G09G 2300/0426* (2013.01); *G09G 2300/0819* (2013.01); *G09G 2300/0842* (2013.01); *G09G 2300/0852* (2013.01); *G09G 2330/028* (2013.01); *G09G 2330/04* (2013.01)

(58) Field of Classification Search
  CPC ... G09G 2300/0842; G09G 2300/0852; G09G 2330/028; G09G 2330/04; G09G 3/3225; G09G 3/3233; G09G 3/3258; H01L 27/3272
  See application file for complete search history.

(56) References Cited

U.S. PATENT DOCUMENTS

| | | | |
|---|---|---|---|
| 6,958,740 | B1 | 10/2005 | Nishikawa |
| 7,057,588 | B2 | 6/2006 | Asano et al. |
| 7,102,202 | B2 | 9/2006 | Kobayashi et al. |
| 7,109,952 | B2 | 9/2006 | Kwon |
| 7,135,712 | B2 | 11/2006 | Broer et al. |
| 7,248,236 | B2 | 7/2007 | Nathan et al. |
| 7,764,262 | B2 | 7/2010 | Lee |
| 8,426,866 | B2 * | 4/2013 | Kimura ............... G09G 3/3233 257/296 |
| 2001/0030323 | A1 | 10/2001 | Ikeda |
| 2002/0011975 | A1 | 1/2002 | Yamazaki et al. |
| 2002/0158835 | A1 | 10/2002 | Kobayashi et al. |
| 2003/0034938 | A1 | 2/2003 | Yamada |
| 2004/0130516 | A1 | 7/2004 | Nathan et al. |
| 2004/0222952 | A1 * | 11/2004 | Huang ............... G06F 3/03542 345/82 |
| 2005/0082540 | A1 | 4/2005 | Nishikawa |
| 2005/0104820 | A1 | 5/2005 | Komiya |
| 2005/0206590 | A1 | 9/2005 | Sasaki et al. |
| 2006/0170635 | A1 | 8/2006 | Umezaki |
| 2006/0176250 | A1 | 8/2006 | Nathan et al. |
| 2006/0192204 | A1 | 8/2006 | Yamaguchi et al. |
| 2006/0208972 | A1 | 9/2006 | Kasai et al. |
| 2006/0246240 | A1 | 11/2006 | Matsuda et al. |
| 2006/0273712 | A1 | 12/2006 | Yaegashi |
| 2007/0029545 | A1 | 2/2007 | Striakhilev et al. |
| 2007/0115224 | A1 | 5/2007 | Yamamoto et al. |
| 2007/0210303 | A1 * | 9/2007 | Ikeda ............... H01L 29/78621 257/40 |
| 2007/0268210 | A1 | 11/2007 | Uchino et al. |

FOREIGN PATENT DOCUMENTS

| | | |
|---|---|---|
| JP | 2000-352941 A | 12/2000 |
| JP | 2002-057341 A | 2/2002 |
| JP | 2002-141509 A | 5/2002 |
| JP | 2003-255856 A | 9/2003 |
| JP | 2003-271095 A | 9/2003 |
| JP | 2004-029791 A | 1/2004 |
| JP | 2004-045636 A | 2/2004 |
| JP | 2004-093682 A | 3/2004 |
| JP | 2004-133240 A | 4/2004 |
| JP | 2004-531752 T | 10/2004 |
| JP | 2005-062794 A | 3/2005 |
| JP | 2005-327523 A | 11/2005 |
| JP | 2007-200765 A | 8/2007 |
| JP | 2007-310311 A | 11/2007 |
| JP | 2007-310346 A | 11/2007 |
| WO | WO-02/067325 A3 | 8/2002 |

OTHER PUBLICATIONS

Japanese Office Action dated May 6, 2010 for corresponding Japanese Application No. 2008-011004.
Japanese Office Action dated Nov. 29, 2011 for the corresponding Japanese Application No. 2010-017669.

* cited by examiner

ELECTROLUMINESCENT DISPLAY PANEL AND ELECTRONIC APPARATUS

CROSS REFERENCES TO RELATED APPLICATIONS

This is a Continuation Application of U.S. patent application Ser. No. 14/640,167, filed Mar. 6, 2015, which is a Continuation Application of U.S. patent application Ser. No. 14/155,805, filed on Jan. 15, 2014, now U.S. Pat. No. 9,001,011, issued Apr. 7, 2015, which is a Continuation Application of U.S. patent application Ser. No. 13/909,382, filed on Jun. 4, 2013, now U.S. Pat. No. 8,633,875, issued on Jan. 21, 2014, which is a Continuation Application of U.S. patent application Ser. No. 12/314,648, filed on Dec. 15, 2008, now U.S. Pat. No. 8,698,707, issued on Apr. 15, 2014, which in turn claims priority from Japanese Application No. 2008-011004, filed in the Japan Patent Office on Jan. 21, 2008, the entire contents of which being incorporated herein by reference.

BACKGROUND OF THE INVENTION

1. Field of the Invention

The present invention relates to an electroluminescent (EL) display panel that works under control by the active matrix driving system. The present invention relates also to a variety of electronic apparatus provided with said EL display panel.

2. Description of the Related Art:

FIG. 1 shows a configuration example of circuit blocks constituting an organic EL panel 1 of active matrix driving type, which is composed of a pixel array part 3, a write control scanner 5 as a driving circuit therefor, a source line scanner 7, and a horizontal selector 9.

The pixel array part 3 has a matrix structure in which each subpixel 11 is at the intersection of the signal line DTL and the write control line WSL. The subpixel 11 is a minimum unit for one pixel. For example, one pixel for white color is composed of three subpixels, representing R (red), G (green), and B (blue), generated by different organic EL materials.

The subpixel 11 described in this specification is compatible with the active driving system, so that it is composed of a light-emitting region (organic EL element) and a pixel circuit. Incidentally, the organic EL element constituting the light-emitting region is a light-emitting element to be excited by current. Therefore, the organic EL panel has its brightness gradient controlled by the amount of current flowing through the organic EL element in each pixel. It is the pixel circuit that maintains the current supply for a prescribed period of time.

For the purpose of reference, there is given patent documents concerning the organic EL display panels that work under control by the active matrix driving system. The documents are Japanese Patent Laid-open Nos. 2003-255856, 2003-271095, 2004-133240, 2004-029791, and 2004-093682.

SUMMARY OF THE INVENTION

FIG. 2 shows one of the simplest pixel circuits constituting the subpixel 11, which consists of thin-film transistors T1 and T2 and a storage capacitor Cs. The thin-film transistors T1 and T2 will be referred to as "sampling transistor T1" and "driving transistor T2," respectively, hereinafter.

The sampling transistor T1 is a thin-film transistor of N-channel type which controls writing of the signal potential Vsig to be applied to the storage capacitor Cs according to the tone of the corresponding pixel. The driving transistor T2 is also a thin-film transistor of N-channel type which supplies the organic EL element OLED with the driving current Ids according to the gate-source voltage Vgs to be determined by the signal potential Vsig held in the storage capacitor Cs.

The write control scanner 5 is a circuit device which controls the on-off action of the sampling transistor T1. The source line scanner 7 is a circuit device which drives the source line DSL at a high potential Vcc and a low potential Vss. The horizontal selector 9 is a circuit device which drives the signal line DTL at a signal potential Vsig corresponding to the pixel data Din and at a reference potential Vofs for correction of the threshold value.

Incidentally, in the light emission period, the source line DSL is driven at a high potential Vcc and the driving current Ids is supplied to the organic EL element OLED from the source line DSL through the driving transistor T2. Incidentally, the driving transistor T2 operates in the saturation region at all times in the light emission period. That is, the driving transistor T2 functions as a constant-current source that supplies the organic EL element OLED with the driving current Ids of a certain magnitude corresponding to the signal potential Vsig.

The driving current Ids is defined as follows.

$$Ids = k \cdot \mu \cdot (Vgs - Vth)^2 \quad (1)$$

where, $\mu$ denotes the mobility of majority carriers in the driving transistor T2, Vth denotes the threshold voltage of the driving transistor T2, and k denotes a coefficient defined as $(W/L) \cdot Cox/2$ (where W is the channel width, L is the channel length, and Cox is the gate capacity per unit area).

Meanwhile, the pixel circuit 11 may be formed not only by the high-temperature polysilicon process but also by the low-temperature polysilicon process or amorphous silicon process. The latter methods, however, tend to give thin-film transistors vulnerable to variation in characteristic properties such as threshold voltage (Vth) and mobility $\mu$.

Particularly, the driving transistor T2 with variation in characteristic properties directly affects the magnitude of the driving current Ids. In other words, it causes the organic EL element to vary in brightness gradation even though the signal potential Vsig remains the same. The variation in brightness becomes visible in the screen when it exceeds a certain limit.

Therefore, the pixel circuit of this type has seen technologies to correct the threshold voltage Vth and mobility $\mu$.

FIGS. 3A to 3E show the driving action with a function to correct characteristic properties, which has been proposed by the present applicant. The driving action represents one of the horizontal lines constituting the vertical resolutions of the pixel array 3. One frame period consists of a non-emitting period and an emitting period, and it is in the non-emitting period that the above-mentioned action to correct characteristic properties is executed.

FIG. 3A represents the waveform of the signal line DTL, FIG. 3B represents the waveform of the write control line WSL, FIG. 3C represents the waveform of the source line DSL, FIG. 3D represents the waveform of the gate potential Vg of the driving transistor T2, and FIG. 3E represents the waveform of the source potential Vs of the driving transistor T2.

The driving action shown in FIGS. 3A to 3E will be briefly described below. The driving action works such that the potential of the source line DSL is switched to the low potential Vss at the timing for start of the non-emitting period. As the result, the source potential Vs of the driving transistor T2 falls to the lower potential Vss. Incidentally, the organic EL element OLED goes out automatically when the source potential Vs falls below Vcat plus Vthel (or the sum of the cathode potential Vcat and the threshold voltage Vthel of the organic EL element OLED).

At the time of this action, the gate electrode of the driving transistor T2 is open and hence the gate potential Vg also falls as the source potential Vs falls.

The following explains the action to correct the threshold value of the driving transistor T2. The action to correct the threshold value of the driving transistor T2 starts when the source line DSL rises again to the high potential Vcc. The high potential Vcc is maintained until the next emission period ends.

The sampling transistor T1 it turned on before the source line DSL rises to the high potential Vcc, and the gate potential Vg of the driving transistor T2 is fixed at the offset potential Vofs. In this way, the gate-source voltage Vgs of the driving transistor T2 is preset to the voltage Vofs–Vss, which is wider than the threshold voltage Vth.

When the source line DSL is switched to the high potential Vcc in this present state, a current flows through the driving transistor T2 and the source potential Vs rises as shown in FIG. 4.

This current flows in such a way as to charge the storage capacitor Cs and the capacitance parasitic on the organic EL element OLED. As the parasitic capacitance is charged, the source potential Vs of the driving transistor T2 rises. When the source potential Vs reaches the voltage Vofs–Vth, the driving transistor T2 becomes off automatically. In this way, the correction of the threshold value is completed. Incidentally, at this point of time, the organic EL element OLED does not emit light because the voltage Vofs–Vth is smaller than the voltage Vcat+Vthel.

Then, the sampling transistor T1 is turned off temporarily. After that, the sampling transistor T1 is turned on again when the signal potential Vsig is applied to the signal wire DTL. As the result, the gate-source voltage Vgs of the driving transistor T2 rises again above the threshold voltage Vth and a current corresponding to the signal potential Vsig begins to flow. This is the action for writing and mobility correction.

In this case, too, the current flows in such a way as to charge the storage capacitor Cs and the capacitance parasitic on the organic EL element OLED. Incidentally, the current that flows through the driving transistor T2 depends largely on the mobility µ; the larger the mobility µ, the larger the current that flows through the driving transistor T2, and the smaller the mobility µ, the smaller the current that flows through the driving transistor T2.

As the result, the driving transistor T2 with a large mobility µ rises in the source potential Vs higher than the one with a small mobility µ. FIG. 5 shows how the driving transistor T2 varies in the source potential Vs depending on the mobility µ.

After the action for mobility correction is completed, the sampling transistor T1 becomes off and the driving current Ids' of the driving transistor T2 begins to flow into the organic EL element OLED. This starts a new emission period of the organic EL element OLED.

The action for correction to be executed at the time of driving as mentioned above is intended to correct the variation of characteristics of the driving transistor T2. In other words, there is no action to correct the variation of characteristics of the sampling transistor T1. One reason for this is that the sampling transistor T1 is driven by switching and is affected little by the variation of its characteristics.

However, the sampling transistor T1 may vary in the threshold voltage Vth (or in the on period) to fluctuate the working point for correction of the mobility of the driving transistor T2. This affects the accuracy of mobility correction or causes the fluctuation of brightness level.

One factor to fluctuate the threshold voltage Vth is a reverse (negative) bias that occurs during the emission period. FIG. 6 shows the potentials in the emission period, with the signal potential Vsig being at a potential for the white tone. Incidentally, the anode potential Vel of the organic EL element OLED (or the source potential Vs of the driving transistor T2) is 5 V, and the gate potential Vg of the driving transistor T2 is 10 V.

On the other hand, the gate potential Vg of the sampling transistor T1 is −3 V, which means that the sampling transistor T1 is continuously given a reverse (negative) bias. Biasing in this manner lowers the threshold voltage Vth of the sampling transistor T1. Moreover, the fluctuation of the threshold voltage Vth is amplified as the scattered light in the panel enters the sampling transistor T1.

FIG. 7 shows the exemplary sectional structure of an organic EL panel of top emission type. "Top emission" means that light emerges from the sealing substrate, which corresponds to the glass substrate 21 in FIG. 7. The sealing substrate may be any transparent material such as plastic film.

The lower surface of the sealing substrate 21 is coated with a highly transparent sealant 23. Under the sealant 23 are sequentially arranged the cathode electrode 25, the organic layer 27, and the anode electrode 29, all of which constitute the organic EL element OLED. The cathode electrode 25 is made of a transparent material and the anode electrode 29 is made of a metallic material.

In the case shown in FIG. 7, an auxiliary wiring 31 is arranged in the gap between the anode electrode 29 and the anode electrode 29. The auxiliary wiring 31 supplies a cathode potential to the cathode electrode 25, and it is formed from the same metallic material as the anode electrode 29. It is used often in large panels but is not so common in small panels. Under the organic EL element OLED is formed the pixel circuit. FIG. 7 shows an example of the thin-film transistor of bottom gate type.

In the case shown in FIG. 7, the pixel circuit is composed of the source electrode 33, the drain electrode 35, the interlayer film 37, the polysilicon layer (channel layer) 39, the gate oxide film 41, and the gate electrode 43. The pixel circuit is formed on the surface of the glass substrate 45, which is a so-called circuit substrate on which are formed driving elements. The interlayer film 47 is formed between the glass substrate 45 and the anode electrode 29 (which is a lower electrode layer of the organic EL element OLED).

The following describes the internally scattered light indicated by a thick line with an arrow. The light generated by the organic EL element OLED is emitted theoretically from the inside of the panel to the outside of the sealing substrate. In actual, however, part of the scattered light is reflected repeatedly in the panel and eventually enters the channel region of the sampling transistor T1 of the adjacent pixel.

FIG. 8 shows the fluctuation of the threshold voltage Vth that occurs when the internally scattered light enters and the application of reverse (negative) bias persists. It is noted from FIG. 8 that the threshold voltage Vth gradually falls in proportion to the stress time and it falls significantly after the stress time exceeds about 1000 seconds.

The experiments showed that the threshold voltage Vth falls in the same way as mentioned above regardless of the color of emitted light and that the threshold voltage Vth falls more significantly as the emitted light decreases in wavelength. In other words, the internally scattered light is most influential when the subpixel 11 emits blue light.

The decrease of the threshold voltage Vth of the sampling transistor T1 extends the on period of the sampling transistor T1 as shown in FIG. 9, which exaggerates the transient characteristics. The extended on period of the sampling transistor T1 results in an increase of the mobility correction time or the fluctuation of the working point of the mobility correction.

The mobility correcting action is accompanied by the increase of the source potential Vs of the driving transistor T2. Therefore, as the correction time extends, the gate-source potential Vgs decreases accordingly. The magnitude of the driving current Ids after mobility correction is expressed by the formula (2) below.

$$Ids = k \cdot \mu \cdot \{(Vsig - Vofs)/[1+(Vsig - Vofs) \cdot k \cdot \mu \cdot t/C]\}^2 \quad (2)$$

It is noted from Formula (2) that the longer the correction time t, the smaller the driving current Ids.

In other words, the great fluctuation in the threshold voltage Vth of the sampling transistor T1 makes the driving current Ids smaller than its original value. In view of the foregoing, it is believed that it is necessary to develop a new technology for protection of the sampling transistor T1 against the internally scattered light that accelerates the fluctuation of the threshold voltage Vth.

Incidentally, the formula 2 above contains "C" which represents the sum of individual capacitances in the subpixel 11. In other words, "C" represents the sum of the capacitance Cs of the storage capacitor, the capacitance Coled of the organic EL element OLED itself, and the capacitance Csub connected in parallel to the organic EL element OLED, as shown in FIG. 10. In fact, the subpixel 11 may not have the capacitance Csub in the thin-film transistor structure.

Also, the formula 2 above contains "t" which is defined by the formula (3) below.

$$t = C/(k \cdot \mu \cdot Vsig) \quad (3)$$

What is proposed herein is an EL display panel having pixel circuits for the active matrix driving system, said EL display panel being characterized by an additional structure to shield internally scattered light.

That is, what is proposed herein is an EL display panel having pixel circuits for the active matrix driving system, having the following configuration: each pixel circuit has a thin-film transistor in which a portion of the metal wiring material above the channel layer thereof is so arranged as to shield the channel region thereof. This additional structure shields the thin-film transistor from internally scattered light.

Incidentally, "a portion of the metal wiring material" mentioned above should preferably be connected to the constant potential line for which the maximum voltage applied across the main electrodes of the thin-film transistor is below the cut-off voltage. However, it may also be connected to the pulse signal line for which the maximum voltage applied across the main electrodes of the thin-film transistor is below the cut-off voltage or to the control line for the gate electrode of the thin-film transistor.

Meanwhile, the shield against internally scattered light is not necessarily restricted to the metal wiring material. Any light-shielding material will reduces the amount of internally scattered light entering the thin-film transistor so long as it has a pattern which shields light (light-shielding pattern).

The light shield may be formed from any semiconducting material doped with metal atoms or any organic material including black filters. Such semiconducting materials or organic materials are inferior to the metal wiring material in light-shielding performance; however, they surely reduce the entry of internally scattered light and hence lower the rate at which the threshold voltage Vth falls.

What is further proposed herein is an electronic apparatus equipped with the EL display panel constructed as mentioned above.

The electronic apparatus is composed of an EL display panel, a system control section to control the operation of the entire system, and an operation input section to accept input operation for the system control section.

The invention proposed herein produces the effect of shielding the channel region from internally scattered light or reducing the amount of internally scattered light reaching the channel region, thereby eliminating the cause of decrease in the threshold voltage Vth of the thin-film transistor. In this way it is possible to minimize the fluctuation in the timing of mobility correction (or increase in the length of time for mobility correction).

DETAILED DESCRIPTION OF THE PREFERRED EMBODIMENT

This section is concerned with the organic EL panel of active matrix driving type to which the present invention is applied.

Not all parts are graphically shown or described in this specification so long as they are known in the relevant technical field. The embodiment explained below is merely one of the embodiments according to the present invention, and it is not intended to restrict the scope of the present invention.

(A) Exterior Structure

The term "organic EL panel" used in this specification embraces not only the display panel composed of a substrate and pixel arrays and driving circuits (such as write control scanner and source line scanner) formed thereon by semiconductor process but also a display panel composed of a substrate and pixel arrays formed thereon and driving circuits mounted thereon in the form of IC manufactured for specific applications.

Figure 11:
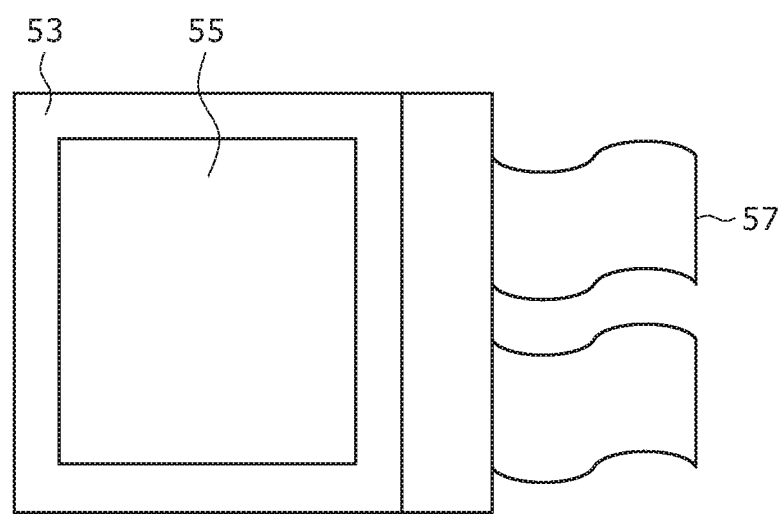
FIG. 11 is a diagram showing an appearance of the organic EL panel.

FIG. 11 shows an exterior structure of the organic EL panel. The organic EL panel 51 is composed of the supporting substrate 53 and the opposed substrate 55 which are bonded together such that the latter fits into the pixel array part of the former.

The supporting substrate 53 is made of glass, plastics, or the like. In the case of top emission structure, the supporting substrate 53 has pixel circuits formed on the surface thereof. That is, the supporting substrate 53 corresponds to the circuit substrate. In the case of bottom emission structure, the supporting substrate 53 has organic EL elements formed on the surface thereof. That is, the supporting substrate 53 corresponds to the sealing substrate.

The opposed substrate 55 is made of glass, plastics, or any other transparent materials. The opposed substrate 55 seals the surface of the supporting substrate 53, with a sealant interposed between them. In the case of top emission structure, the opposed substrate 55 corresponds to the sealing substrate. In the case of bottom emission structure, the opposed substrate 55 corresponds to the circuit substrate.

Incidentally, the organic EL panel 51 is provided with the FPC (flexible printed circuit) 57 for introduction of external signals and driving power.

(B) Embodiment (B-1) System Structure

Figure 12:
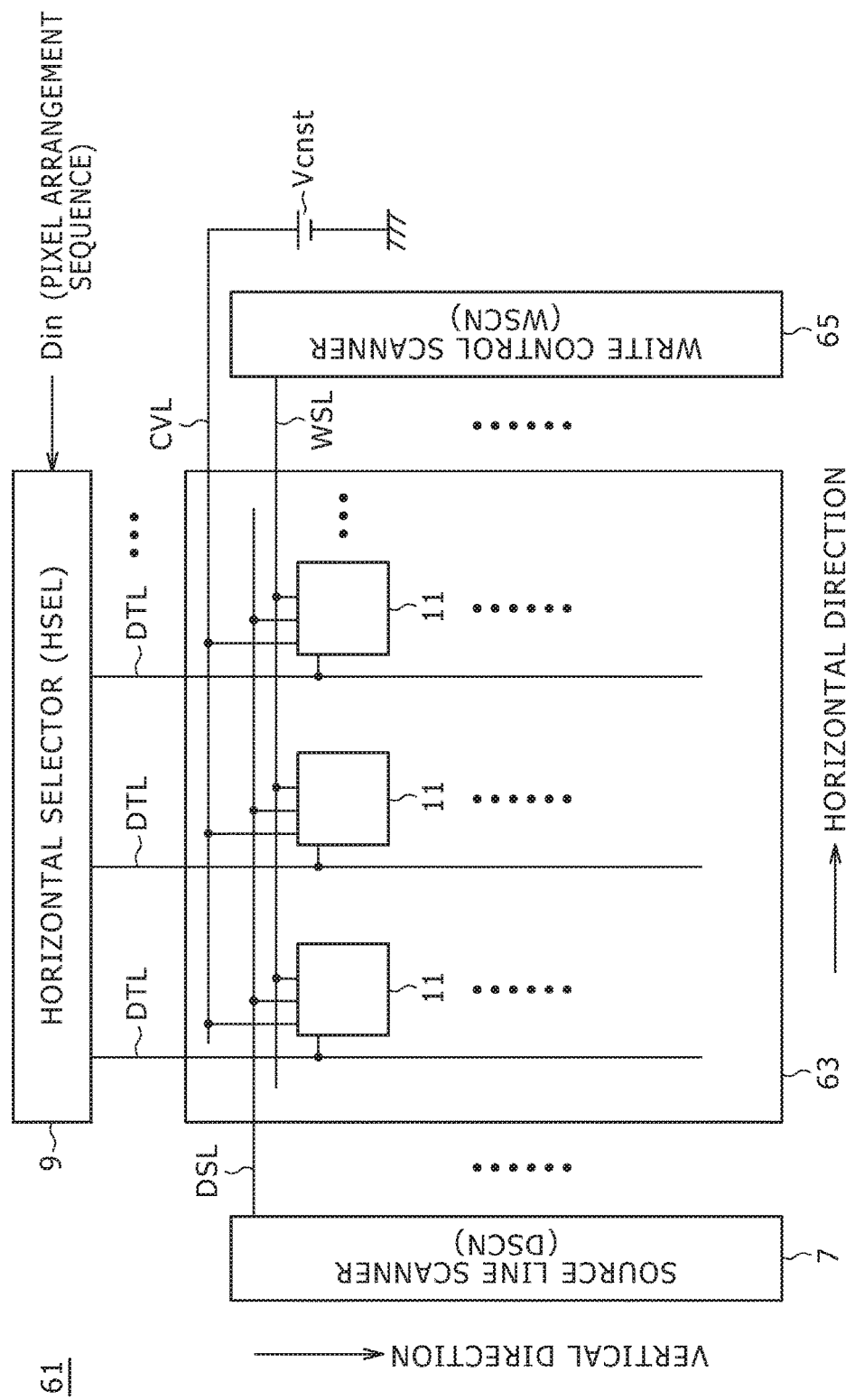
FIG. 12 is a diagram illustrating connection between the pixel circuit and the driving circuit.

FIG. 12 shows the exemplary system structure of the organic EL panel 61. The corresponding parts in FIGS. 1 and 12 are identified by the same symbols.

The organic EL panel 61 shown in FIG. 12 is composed of the pixel array part 63, the write control scanner 65 (as the driving circuit for the pixel array part 63), the source line scanner 7, and the horizontal selector 9.

(1) Structure of the Pixel Array Part

Figure 1:
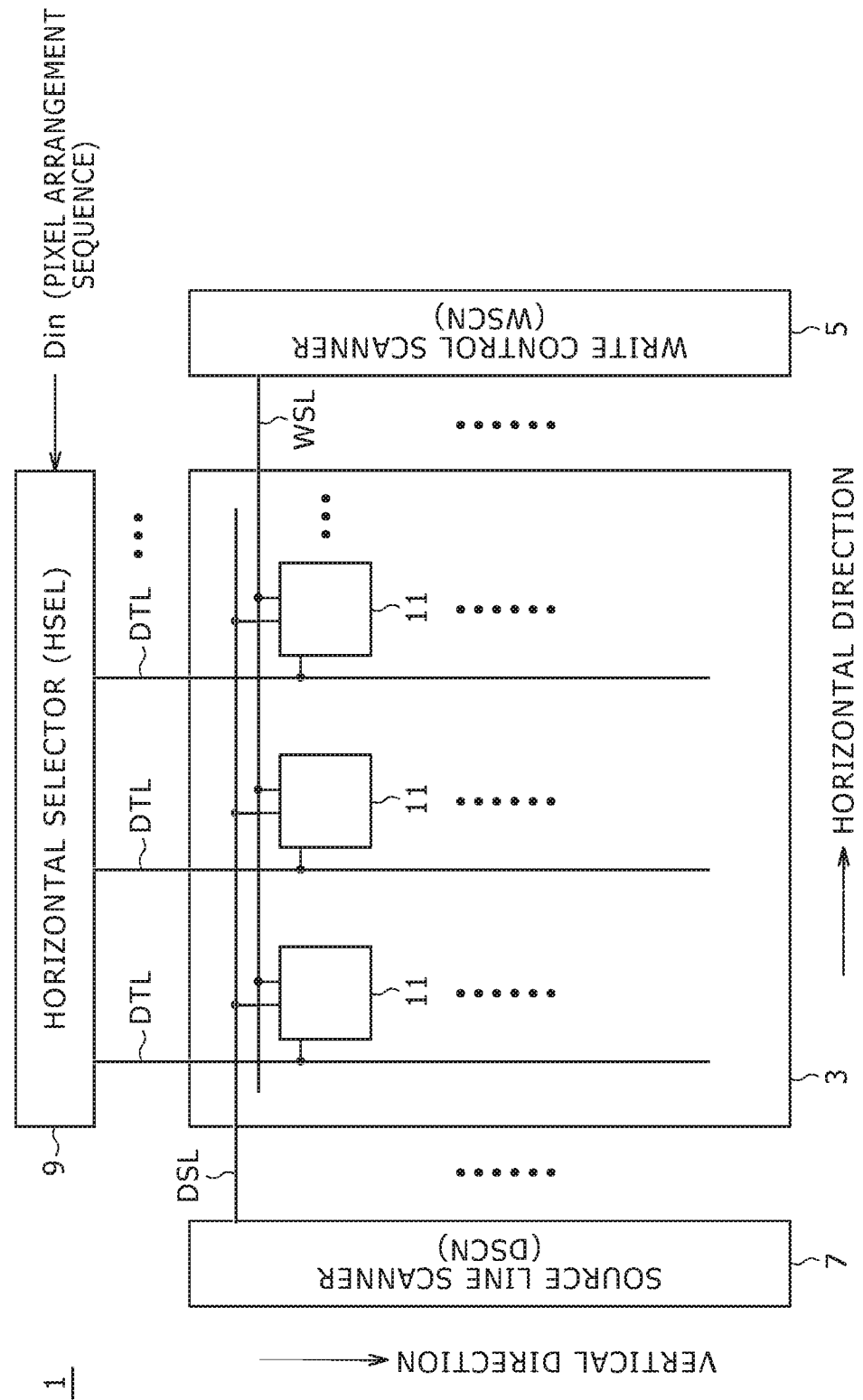
FIG. 1 is a block diagram illustrating the function of the organic EL panel.

The pixel array part 63 has the same structure as shown in FIG. 1. That is, it has the matrix structure consisting of signal lines DTL and write control lines WSL, with each subpixel 11 placed at the intersection of the two lines. The difference in structure is that the light shield pattern 67 is arranged above the channel layer in such a way that it entirely covers the channel layer of the sampling transistor T1.

The light shield pattern 67 corresponds to "a portion of a pattern of the metal wiring material" or "light shield pattern" as used in the claims.

Figure 13:
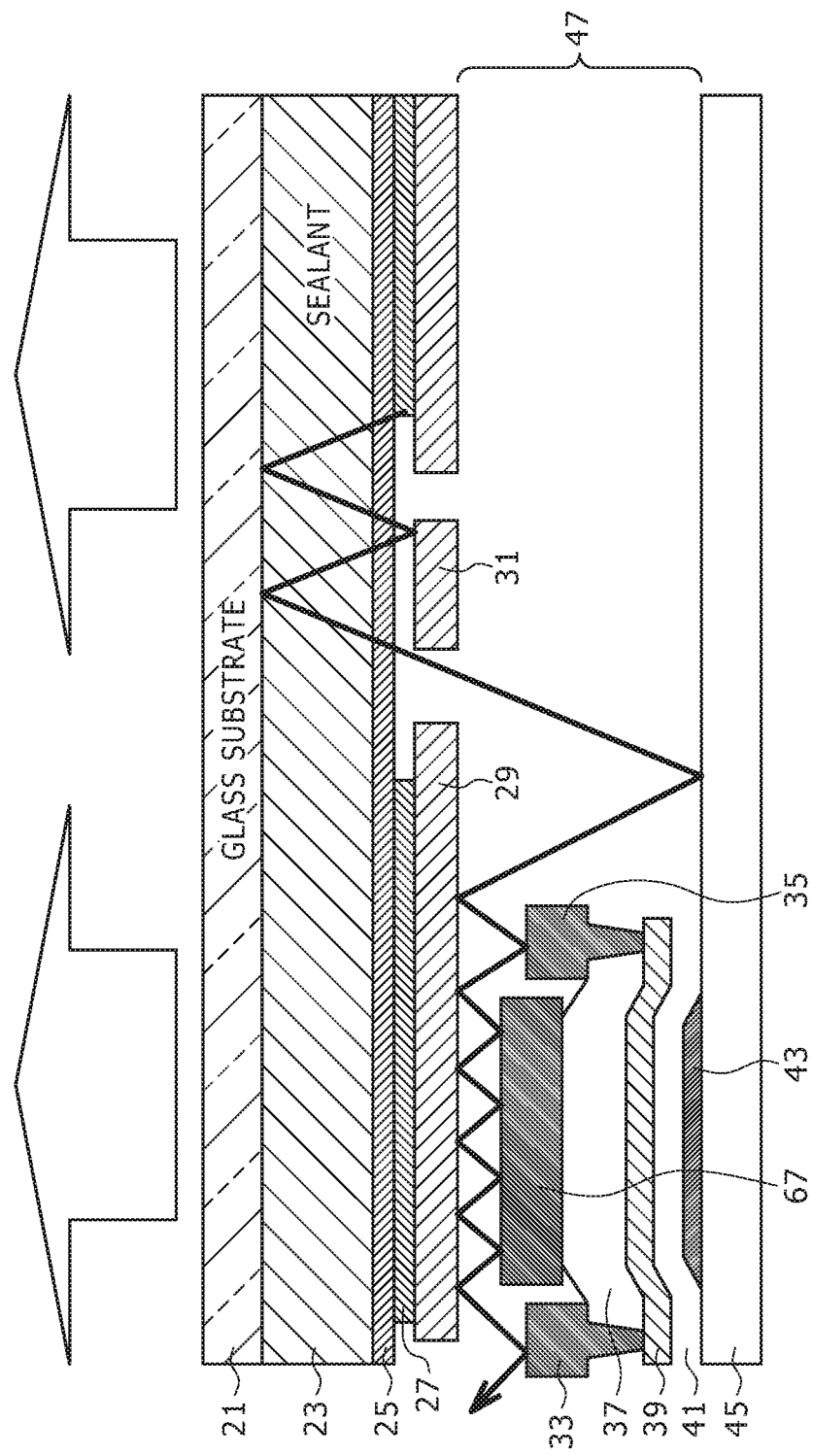
FIG. 13 is a diagram illustrating the passage through which internally scattered light propagates in the case where the light shield is used.

FIG. 13 shows the positional relationship of the light shield pattern 67 and the channel layer of the sampling transistor T1. The light shield pattern 67 is arranged above the channel layer of the sampling transistor T1 such that it entirely covers the channel layer. Incidentally, the light shield pattern 67 is independent of or separate from the neighboring patterns.

The light shield pattern 67 is formed from the same metallic material (e.g., aluminum and molybdenum) as the signal wire DTL.

Consequently, the light shield pattern 67 reflects the internally scattered light which has been reflected by the anode electrode 29 and returned into the panel inside, thereby preventing the internally scattered light from entering the channel layer.

The light shield pattern 67 can be formed at the same time as the metal wiring layers (source electrode 33 and drain electrode 35) are formed. Therefore, it can be formed without the necessity of additional processes and hence it does not add to the production cost. However, there should be a sufficient distance between the light shield pattern 67 and the main electrodes to avoid short-circuiting between them.

Incidentally, the light shield pattern 67 should preferably be so arranged as to cover the sampling transistor T1 as well as the entire channel layer of the driving transistor T2. However, the light shield pattern 67 may be so arranged as to cover only the entire channel layer of the sampling transistor T1 as in this embodiment, because the driving transistor T2 has a function to correct the threshold value.

Also, in this embodiment, the light shield pattern 67 can be formed at the same time as the main electrodes (source electrode 33 and drain electrode 35) of the sampling transistor T1 are formed. Therefore, it can be formed without the necessity of additional processes and hence it does not raise the production cost.

In the meantime, the light shield pattern 67 is kept at a constant potential Vcnst through the constant source line CVL. The constant potential Vcnst is supplied from a source arranged anywhere on the panel.

The constant potential Vcnst should be kept below a potential (cut-off potential) which does not activate the sampling transistor T1 into on state except the period in which it is turned on by the write control line WSL. In other words, the constant potential Vcnst should be set such that it is not higher by the threshold voltage than all the potentials to be applied to the main electrodes of the sampling transistor T1 except the period in which the sampling transistor T1 is activated by the write control line WSL.

Needless to say, the constant potential Vcnst should be established by taking it into consideration that the threshold voltage Vth of the sampling transistor T1 changes with time. In other words, it should have a sufficient margin in anticipation of fluctuation. In this way it is possible to prevent the sampling transistor T1 from becoming on at unexpected timing and the storage capacitor Cs from changing in potential.

(2) Structure of the Write Control Scanner

Figure 2:
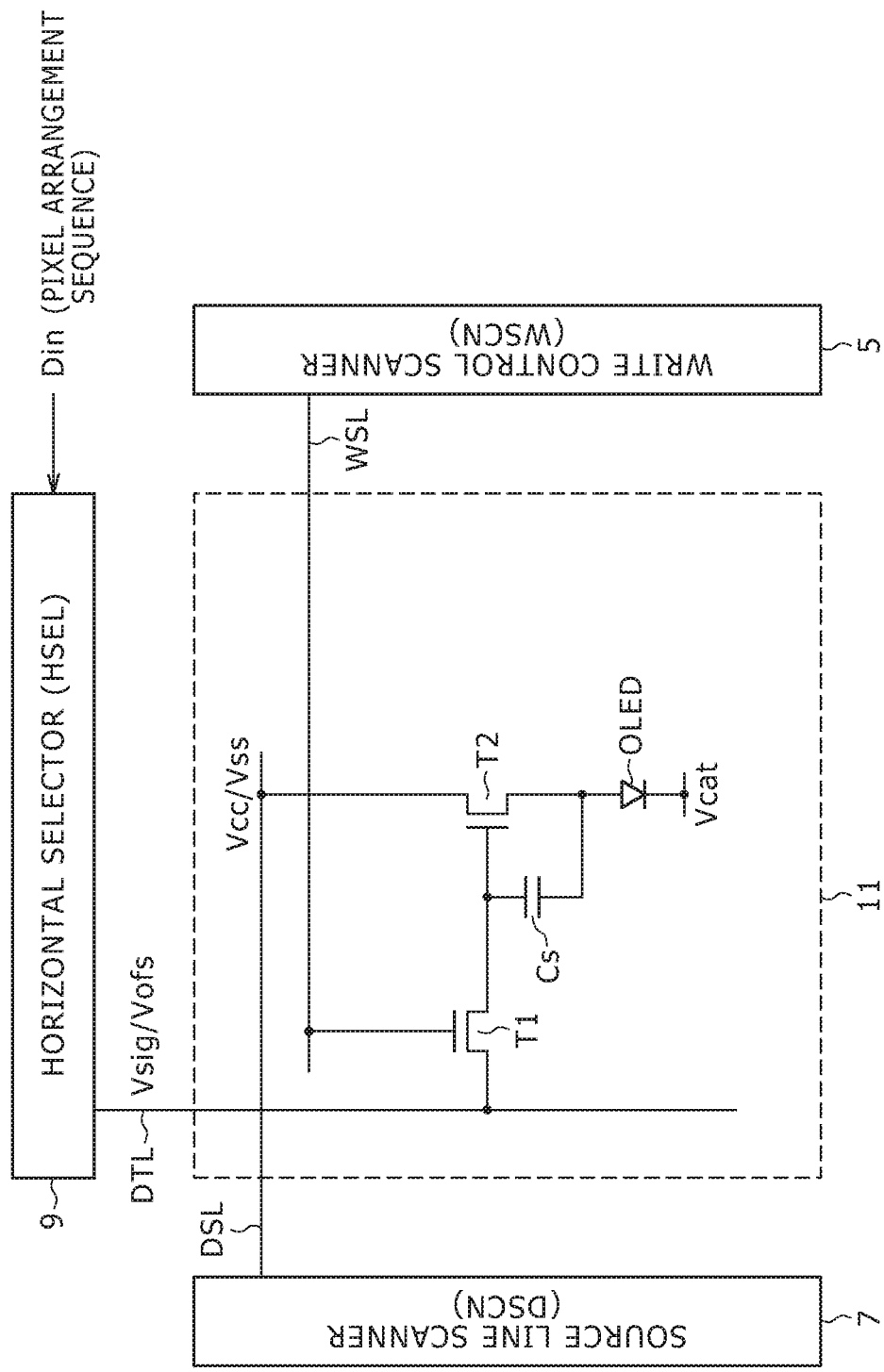
FIG. 2 is a diagram illustrating connection between the pixel circuit and the driving circuit.
Figure 14:
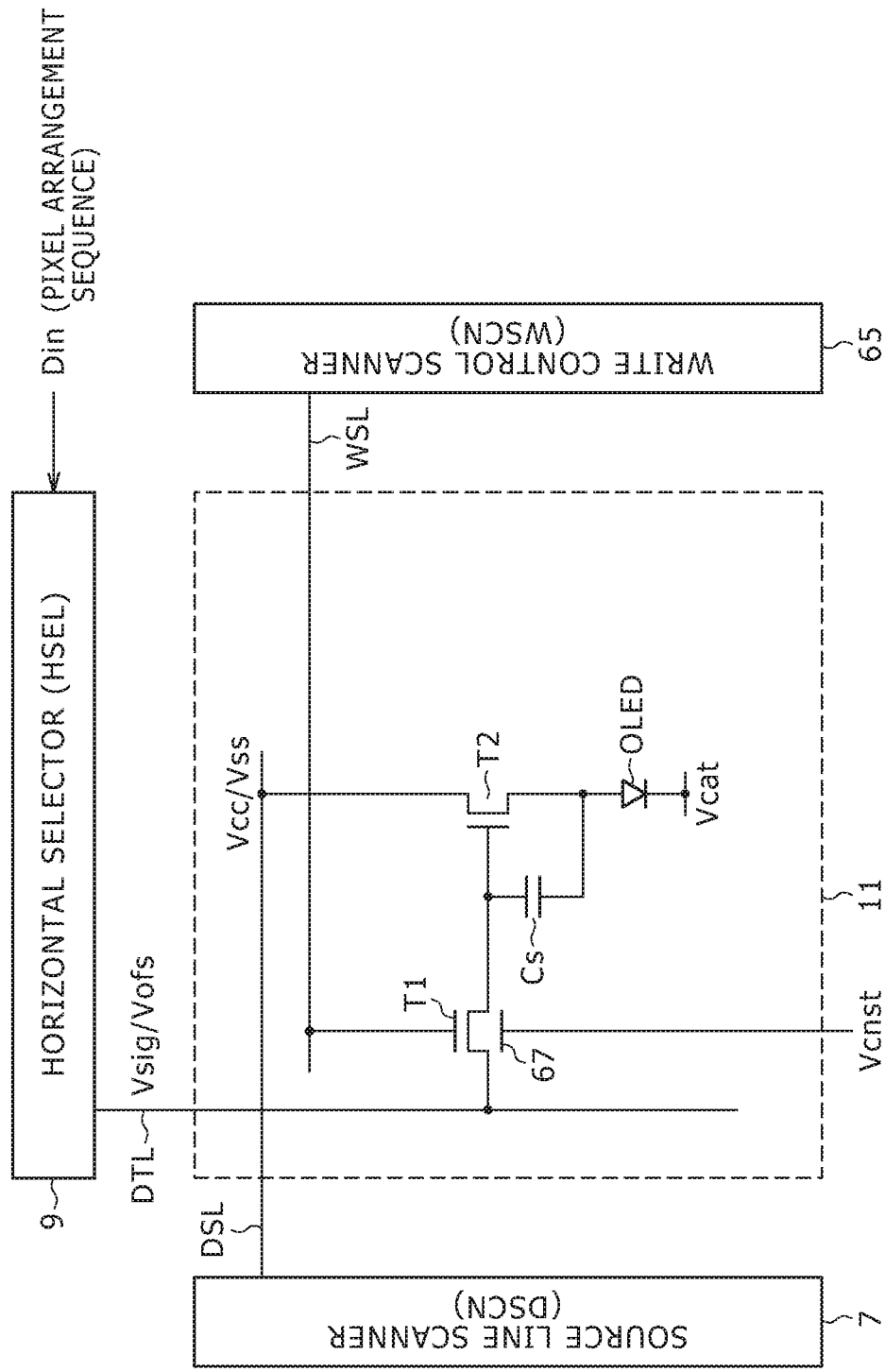
FIG. 14 is a diagram showing the structure of the pixel circuit pertaining to an embodiment.

FIG. 14 shows the connection relation between the pixel circuit 11 and the driving circuits. The connection relation shown in FIG. 14 is identical with that shown in FIG. 2. That is, the write control line WSL, which is driven and controlled by the write control scanner 65, is connected to the gate electrode of the sampling transistor T1, and the source line DSL, which is driven and controlled by the source line scanner 7, is connected to one of the main electrodes of the driving transistor T2.

The embodiment is differentiated by the write control scanner 65, which optimizes the time for mobility correction according to the gradation brightness.

Figure 15:
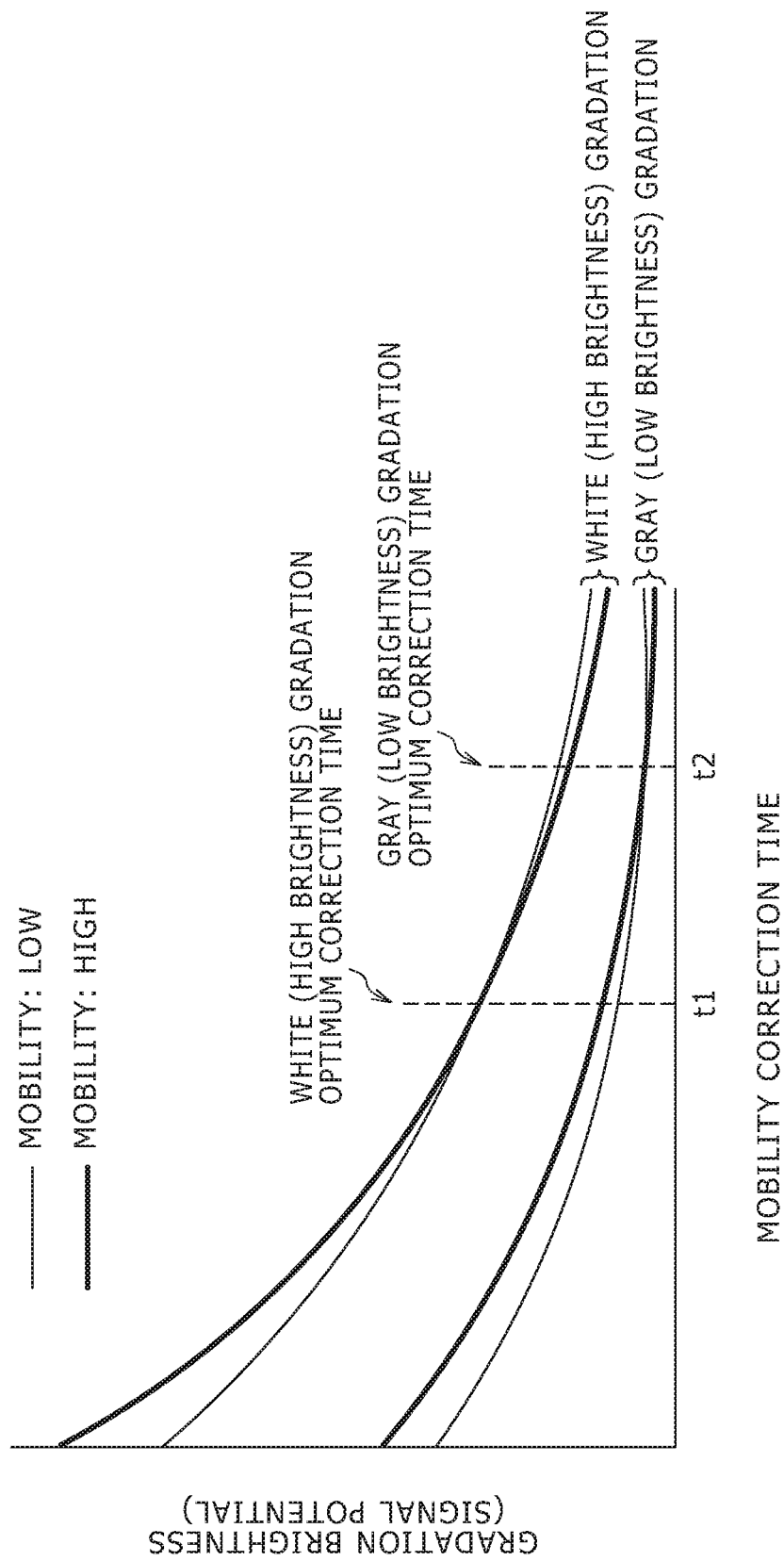
FIG. 15 is a diagram illustrating the relation between the gradation brightness and the time for mobility correction.

FIG. 15 shows the relation between the gradation brightness and the time for mobility correction. In FIG. 15, the abscissa represents the time for mobility correction, and the ordinate represents the gradation brightness (signal potential Vsig).

It is noted from FIG. 15 that, in the case of high brightness (white tone), the brightness level of the driving transistor T2 having a high mobility μ coincides with the brightness level of the driving transistor T2 having a low mobility μ at the time t1 for mobility correction. In other words, the time for mobility correction should desirably be t1 in the case of high brightness pixels.

It is also noted from FIG. 15 that, in the case of low brightness (gray tone), the brightness level of the driving transistor T2 having a high mobility μ coincides with the brightness level of the driving transistor T2 having a low mobility μ at the time t2 for mobility correction. In other words, the time for mobility correction should desirably be t2 in the case of low brightness pixels.

In the case of the driving system in which the time for mobility correction is fixed, the time for mobility correction may be longer or shorter than necessary for the pixel circuit at the brightness level other than specific ones. This causes visual confirmation as luminance irregularity or stripes, at worst.

Consequently, the write control scanner 65 is provided with the function to adjust automatically the time for mobility correction of each pixel circuit according to the brightness level of each pixel.

This is achieved by the driving function which makes the time for mobility correction shorter automatically for the pixel circuit corresponding to the high brightness level, and also makes the time for mobility correction longer automatically for the pixel circuit corresponding to the low brightness level.

Incidentally, the time for mobility correction is the time for on action for the sampling transistor T1.

Figure 16:
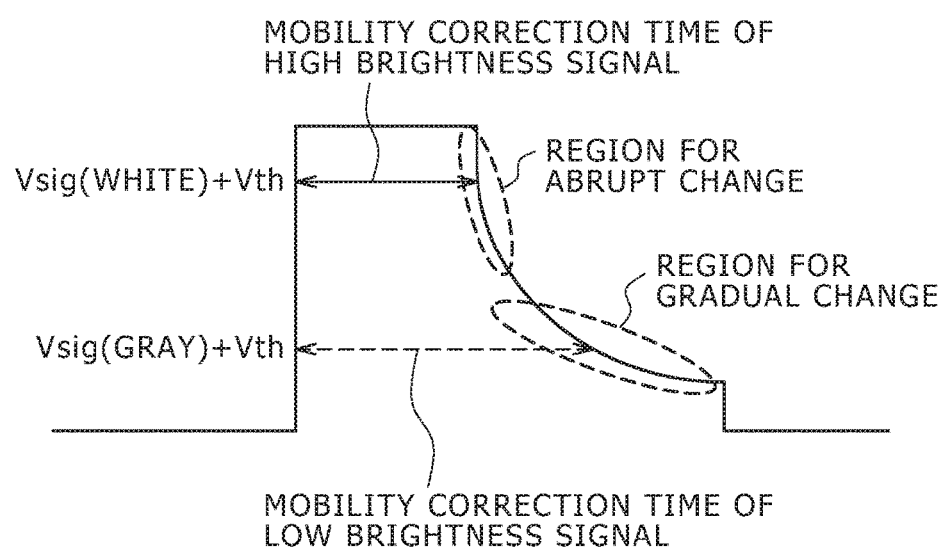
FIG. 16 is a diagram illustrating the waveform of the write control signal to be used to optimize the time for mobility correction according to the gradation brightness.

The write control scanner 65 in this embodiment is provided with the function that causes the write control signal for the sampling transistor T1 to have the waveform shown in FIG. 16 during the period of mobility correction. The write control signal shown in FIG. 16 has a waveform region in which potential drops abruptly and a waveform region in which potential drops gradually.

The effect produced by this write control signal is that the gate-source voltage Vgs of the sampling transistor T1 becomes smaller (for automatic cutoff) than the threshold voltage Vth in the region where the waveform changes abruptly in the case of high brightness pixels and that the gate-source voltage Vgs of the sampling transistor T1 becomes smaller (for automatic cutoff) than the threshold voltage Vth in the region where the waveform changes gradually in the case of low brightness pixels.

This means that the time for mobility correction for each pixel is automatically adjusted according to the magnitude of the signal potential Vsig and the optimal action for mobility correction is ensured even though the signal potential Vsig varies.

Figure 17:
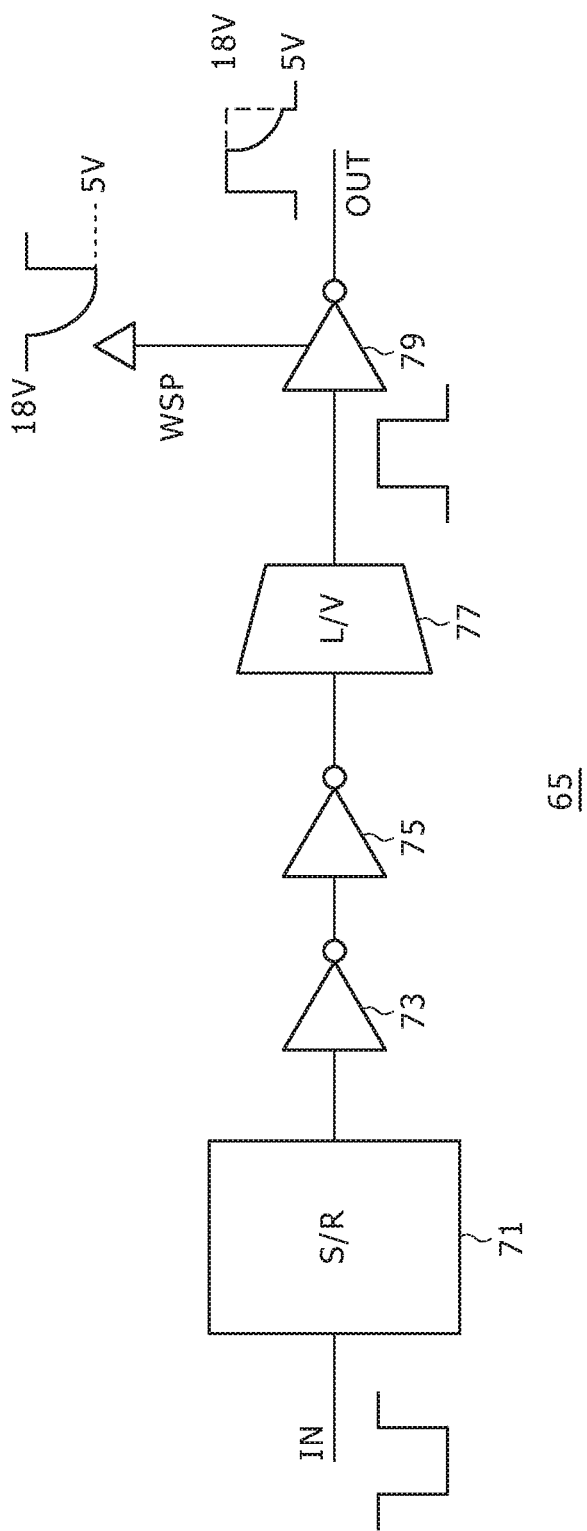
FIG. 17 is a diagram illustrating the circuit structure of the write control scanner pertaining to the embodiment.

FIG. 17 shows the partial structure of the write control scanner 65 which generates the write control signals mentioned above. The partial structure corresponds to one horizontal line. Therefore, one screen contains in the vertical direction as many circuits (shown in FIG. 17) as the number of vertical resolution.

This partial circuit is also referred to as the write control scanner 65 hereinafter. The write control scanner 65 is composed of the shift register 71, the buffer circuit composed of the two-stage inverter circuits 73 and 75, the level shifter 77, and the output buffer circuit composed of the one-stage inverter circuit 79. It is characterized in that the waveform level of the source voltage pulse WSP supplied to the inverter circuit 79 falls as shown in FIG. 16.

Figure 18:
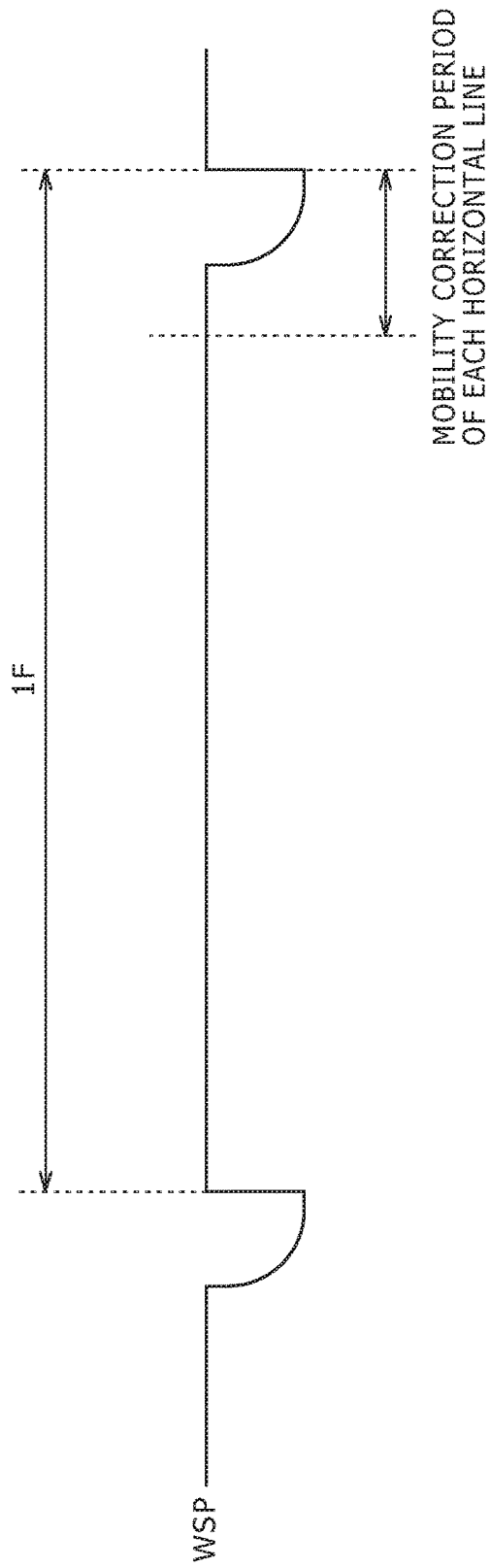
FIG. 18 is a diagram illustrating the waveform of the source voltage pulse pertaining to the embodiment.

Needless to say, the timing for the waveform level to fall should be implemented in synchronism with the period for mobility correction of each horizontal line, as shown in FIG. 18.

Figure 19:
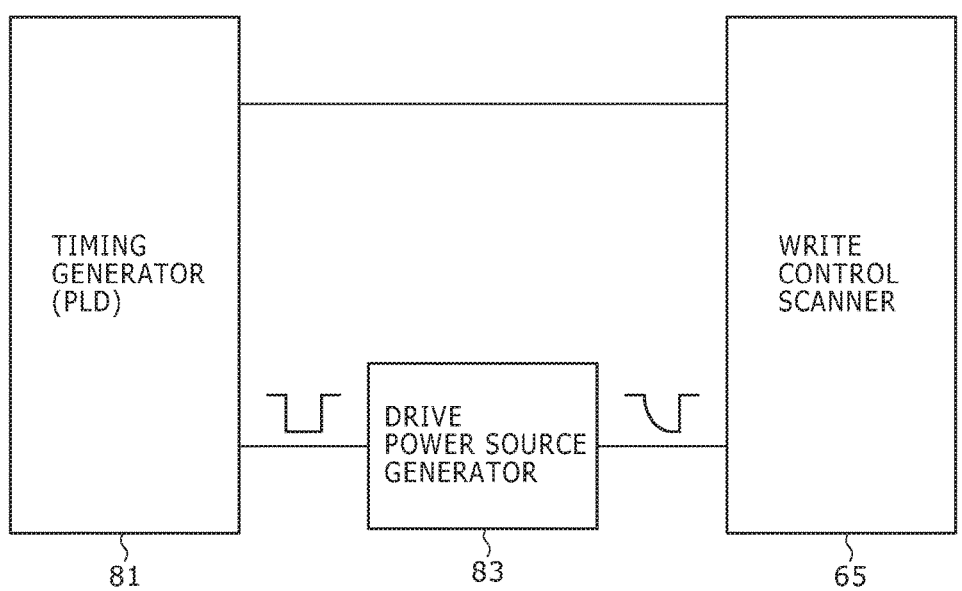
FIG. 19 is a diagram illustrating the circuit to generate the source voltage pulse.

FIG. 19 shows the structure of the circuit device that generates the source voltage pulse WSP to be supplied to the write control scanner 65.

The source voltage pulse WSP is generated by the timing generator 81 and the driving source generator 83. The timing generator 81 is a circuit device to supply driving pulses (rectangular wave) to the write control scanner 65 as well as the source line scanner 7 and the horizontal scanner 9. Incidentally, the fall timing of the driving pulse is so established as to lag for a prescribed time behind the timing to start mobility correction.

The drive power source generator 83 is a circuit device which generates the driving voltage pulse WSP (FIG. 18) whose waveform bends in two steps at the fall time according to the drive pulse in rectangular waveform.

Figure 20:
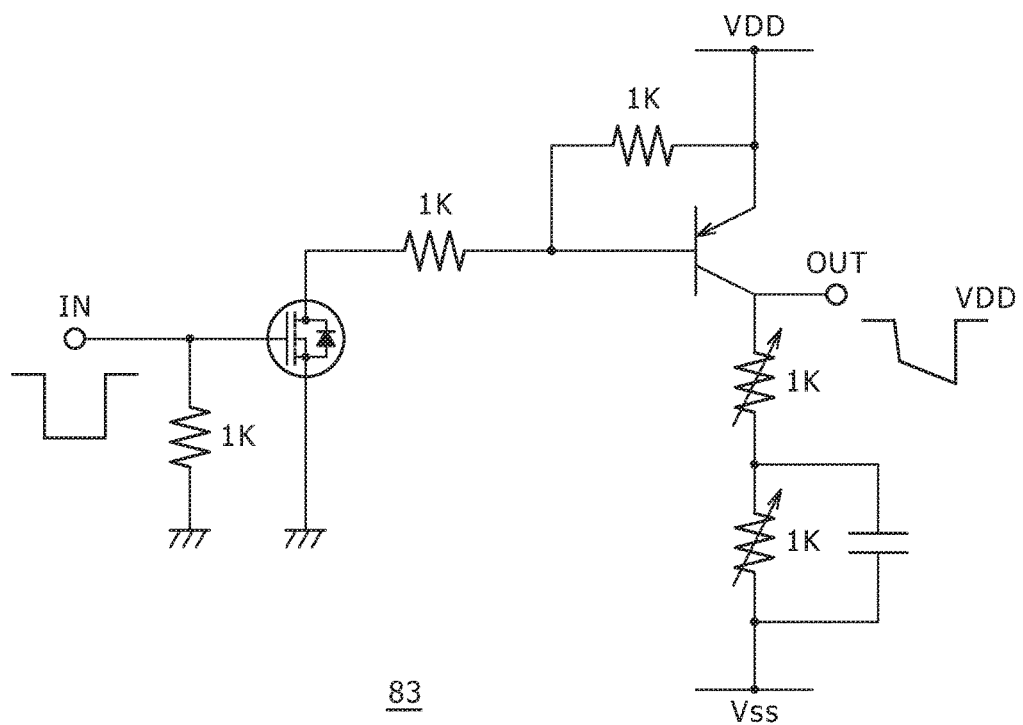
FIG. 20 is a diagram illustrating the exemplary internal structure of the driving source generator.

FIG. 20 shows a circuit for the drive power source generator 83, which is composed of two transistors, one capacitor, three fixed resistors, and two variable resistors.

The drive power source generator 83 generates, through analogue processing of driving pulse, the driving voltage pulse WSP whose waveform bends in two steps at the fall time. That is, it generates the source voltage pulse WSP whose fall waveform has a steep slope in the first step and a gentle slope in the second step.

(B-2) Driving Action and Effect

Figure 3:
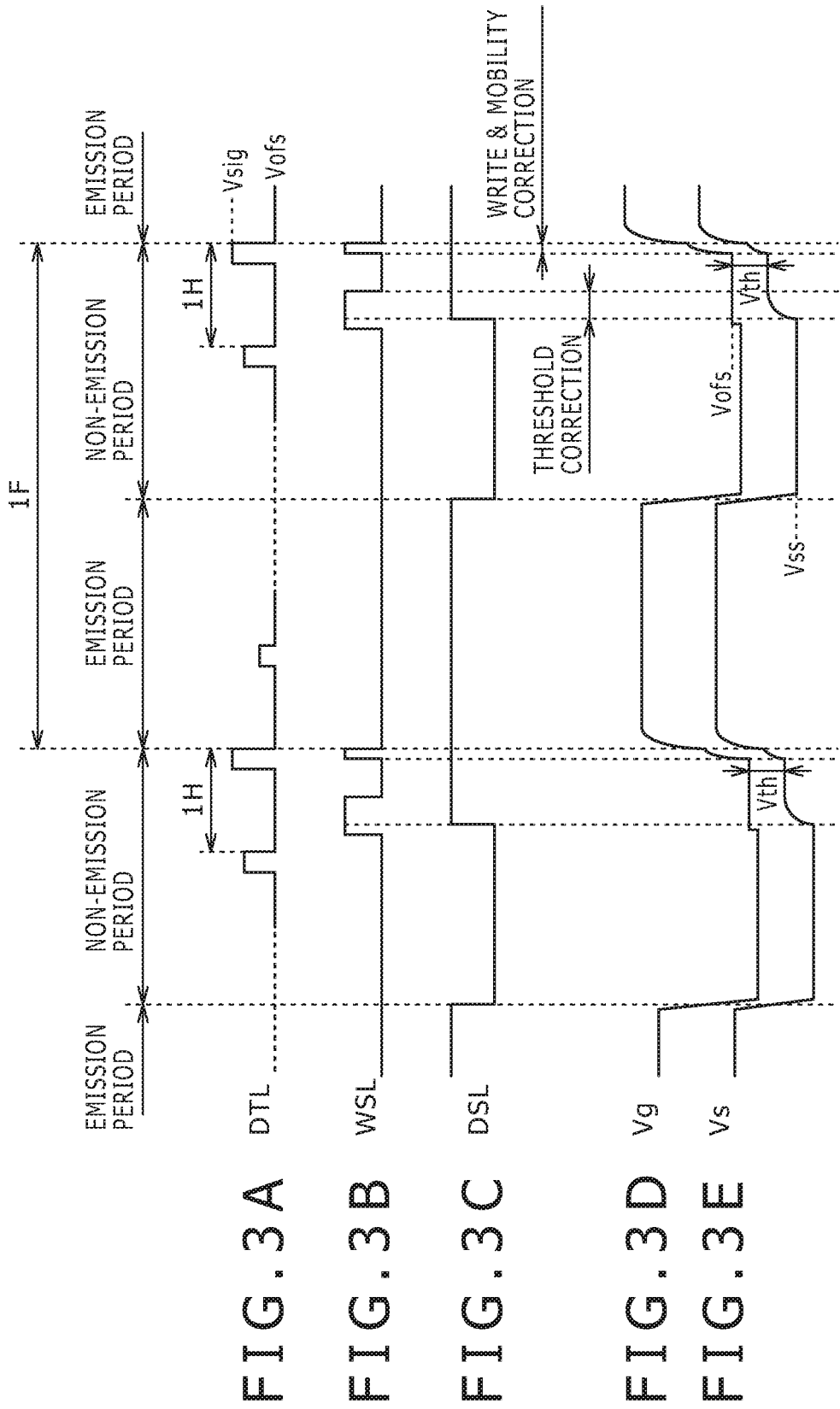
FIGS. 3A to 3E are diagrams illustrating the driving action of the pixel circuit shown in FIG. 2.
Figure 4:
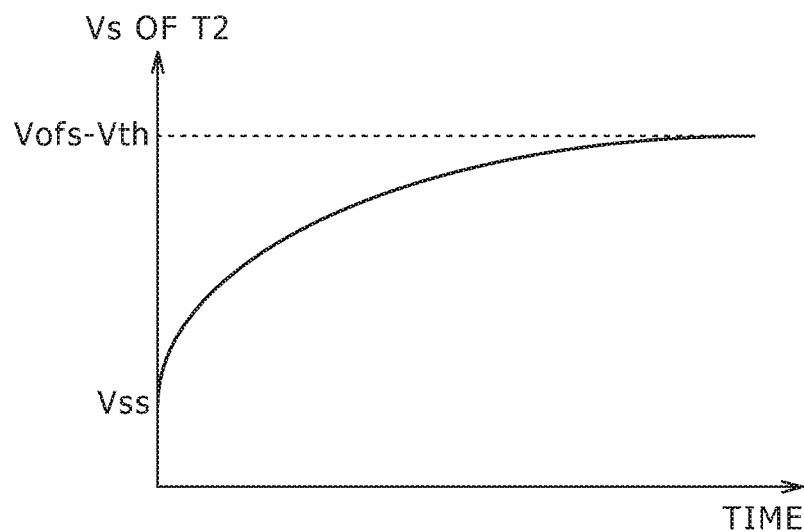
FIG. 4 is a diagram illustrating the change in source potential of the driving transistor that takes place when the threshold value is corrected.
Figure 5:
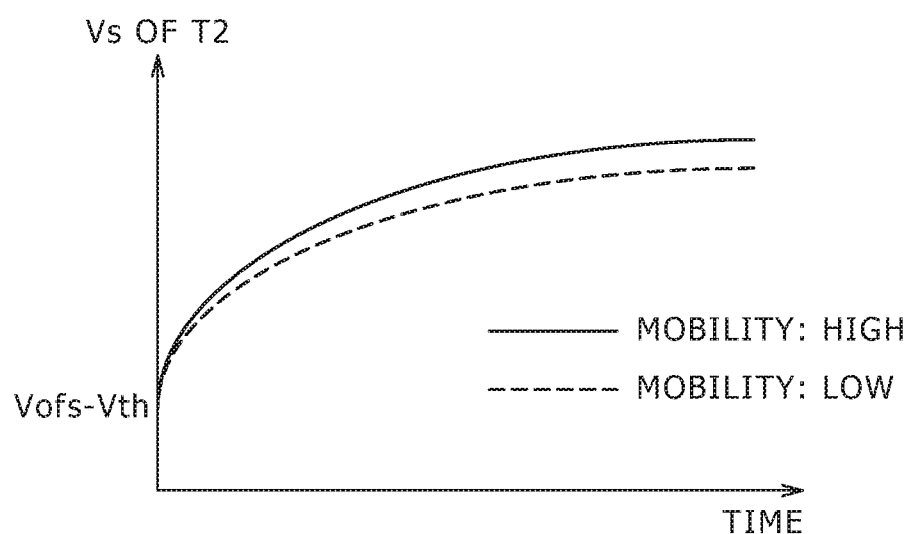
FIG. 5 is a diagram illustrating the change in source potential of the driving transistor that takes place when the mobility is corrected.
Figure 6:
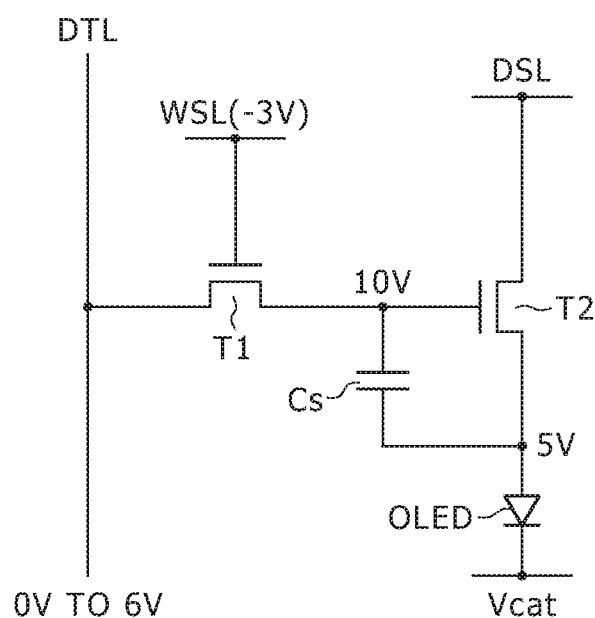
FIG. 6 is a diagram illustrating potentials in the pixel circuit during the emission period.
Figure 7:
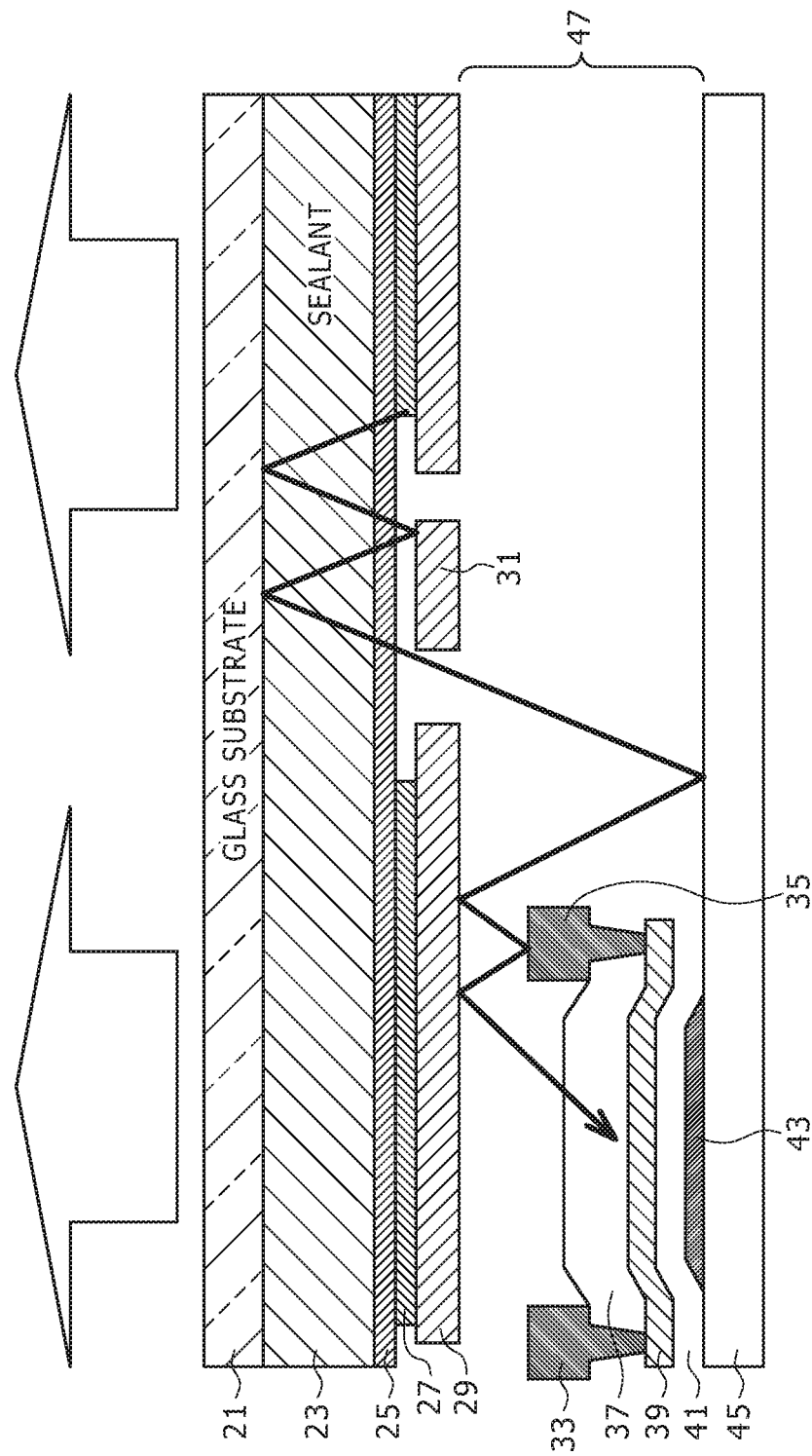
FIG. 7 is a diagram illustrating the passage through which internally scattered light propagates.
Figure 8:
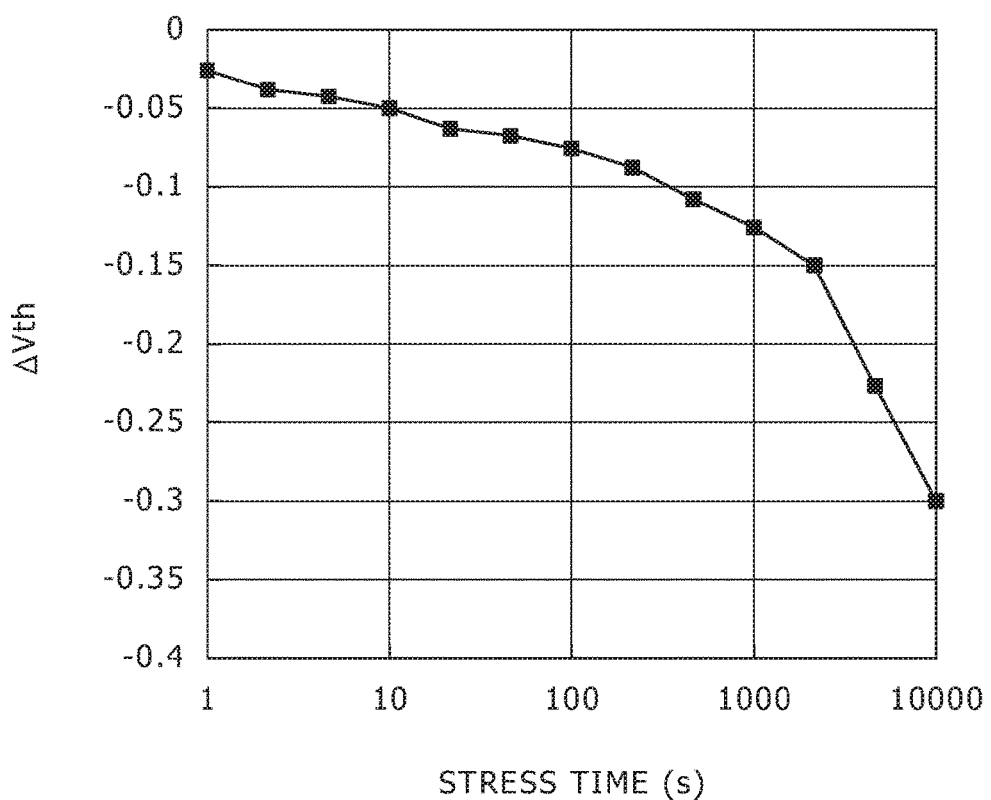
FIG. 8 is a diagram illustrating the fluctuation in the threshold voltage of the sampling transistor.
Figure 9:
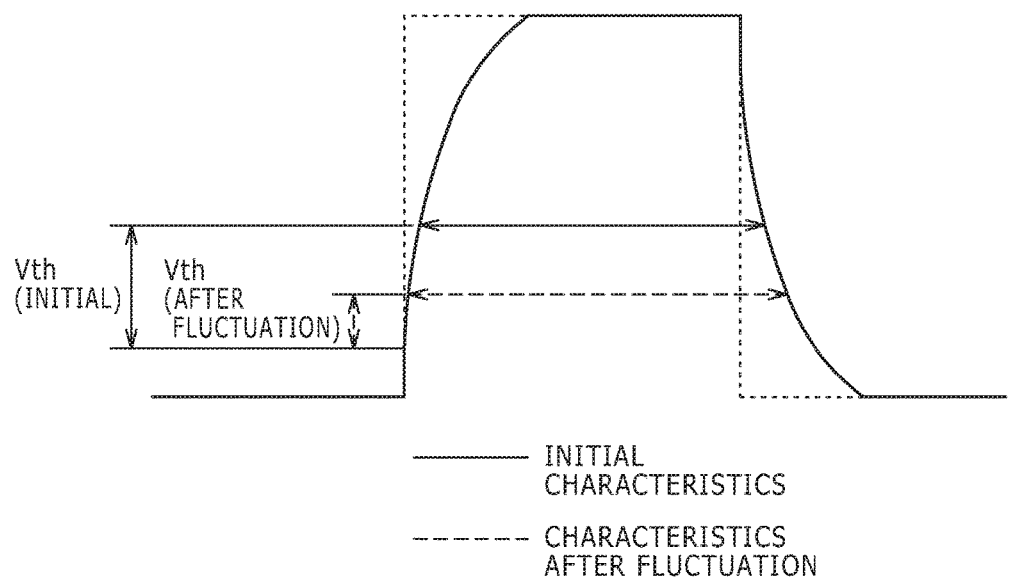
FIG. 9 is a diagram illustrating the relation between the fluctuation in the threshold voltage and the time for mobility correction.
Figure 10:
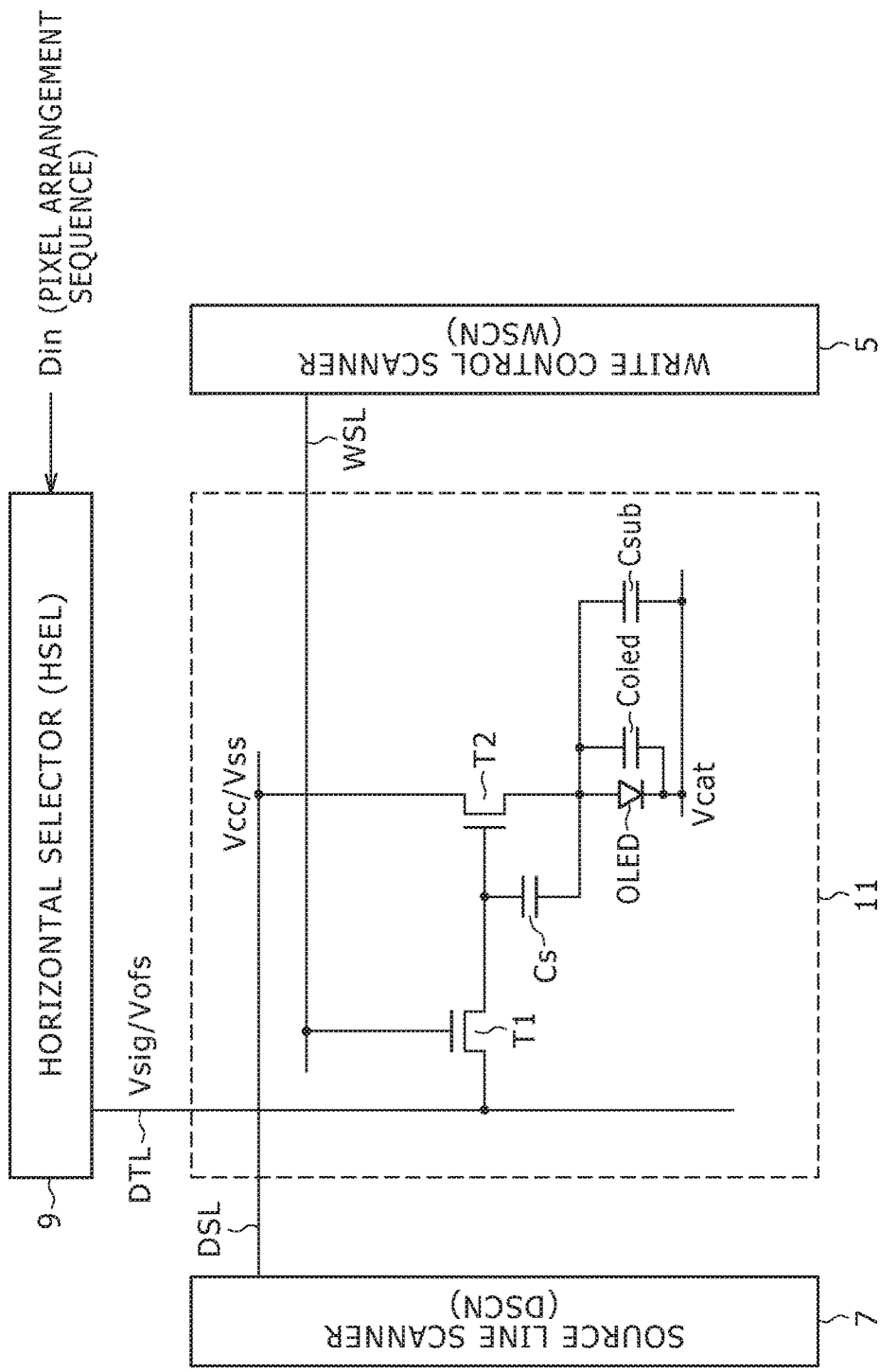
FIG. 10 is a diagram illustrating the capacitances that affect the driving current.

In this embodiment, the driving action is identical with that shown in FIG. 3 except for action in the period for mobility correction. Incidentally, the light beam emitted from each subpixel 11 toward the panel surface partly remains inside the glass substrate 21 as the result of internal scattering.

However, in this embodiment, the entry of internally scattered light into the channel layer is blocked by the light shield pattern 67 arranged above the channel layer of the sampling transistor T1.

This mechanism prevents the threshold voltage Vth of the sampling transistor T1 from fluctuation and maintains the time for mobility correction in its optimal condition.

The shielding of internally scattered light produces its better effect when employed in combination with the driving system that works at the time of mobility correction, as proposed in this embodiment.

As mentioned above, this embodiment employs the source voltage pulse WSP whose waveform falls in two steps after a certain period of time from the start for mobility correction so that the time of mobility correction is automatically optimized according to the magnitude of the signal potential Vsig.

Figure 21A:
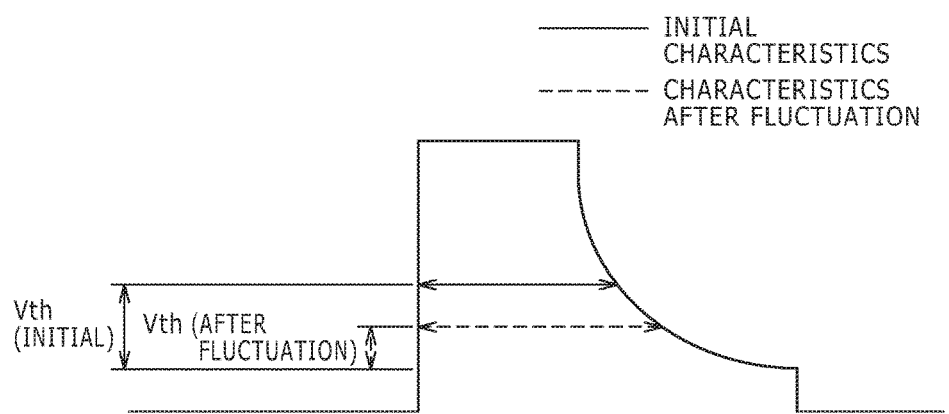
FIGS. 21A and 21B are diagrams illustrating the effect which is produced when the light shield pattern is combined with the write control signal shown in FIG. 16.

Consequently, as the fluctuation of the threshold voltage Vth becomes larger, the time for mobility correction greatly changes, as shown in FIG. 21A. This is true particularly in the case of the signal potential Vsig for which the region where the source voltage pulse WSP steeply falls is the optimal time for mobility correction. In this case, as the threshold voltage Vth falls, the on time of the sampling transistor T1 greatly changes. This is a problem inherent in the driving system which makes dull in two steps the waveform of the source voltage pulse WSP of the time for mobility correction.

Figure 21B:
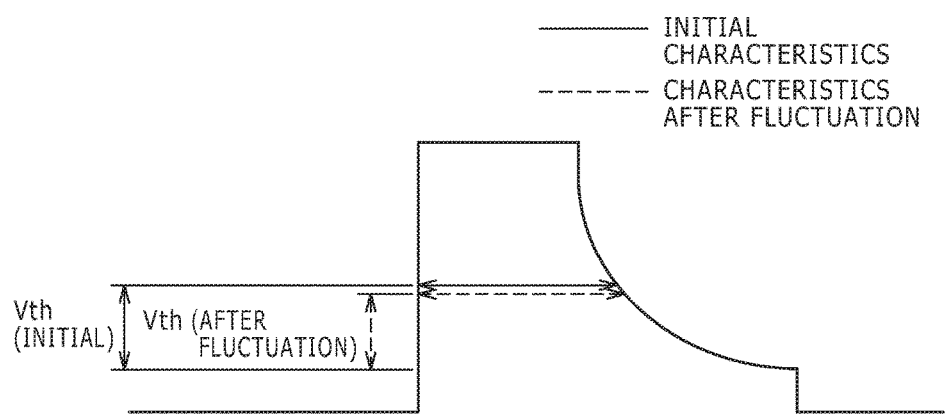

However, in this embodiment, which is so designed as to minimize the fluctuation of the threshold voltage Vth by shielding the internally scattered light, it is possible to prevent the actual time for mobility correction from greatly shifting from the optimized time for mobility correction for each signal potential Vsig as shown in FIG. 21B.

Thus, the shielding of internally scattered light stabilizes by itself the working point of the time for mobility correction, and it produces a better effect when combined with the technique of optimizing the time for mobility correction.

(C) Other Embodiments

(C-1) Electric Supply to the Light Shield Pattern

The foregoing embodiment has demonstrated the instance in which the light shield pattern 67 is supplied with the constant potential Vcnst. However, another instance is also possible in which the light shield pattern 67 is driven by a pulse power source. The panel may have the same sectional structure as shown in FIG. 13.

Figure 22:
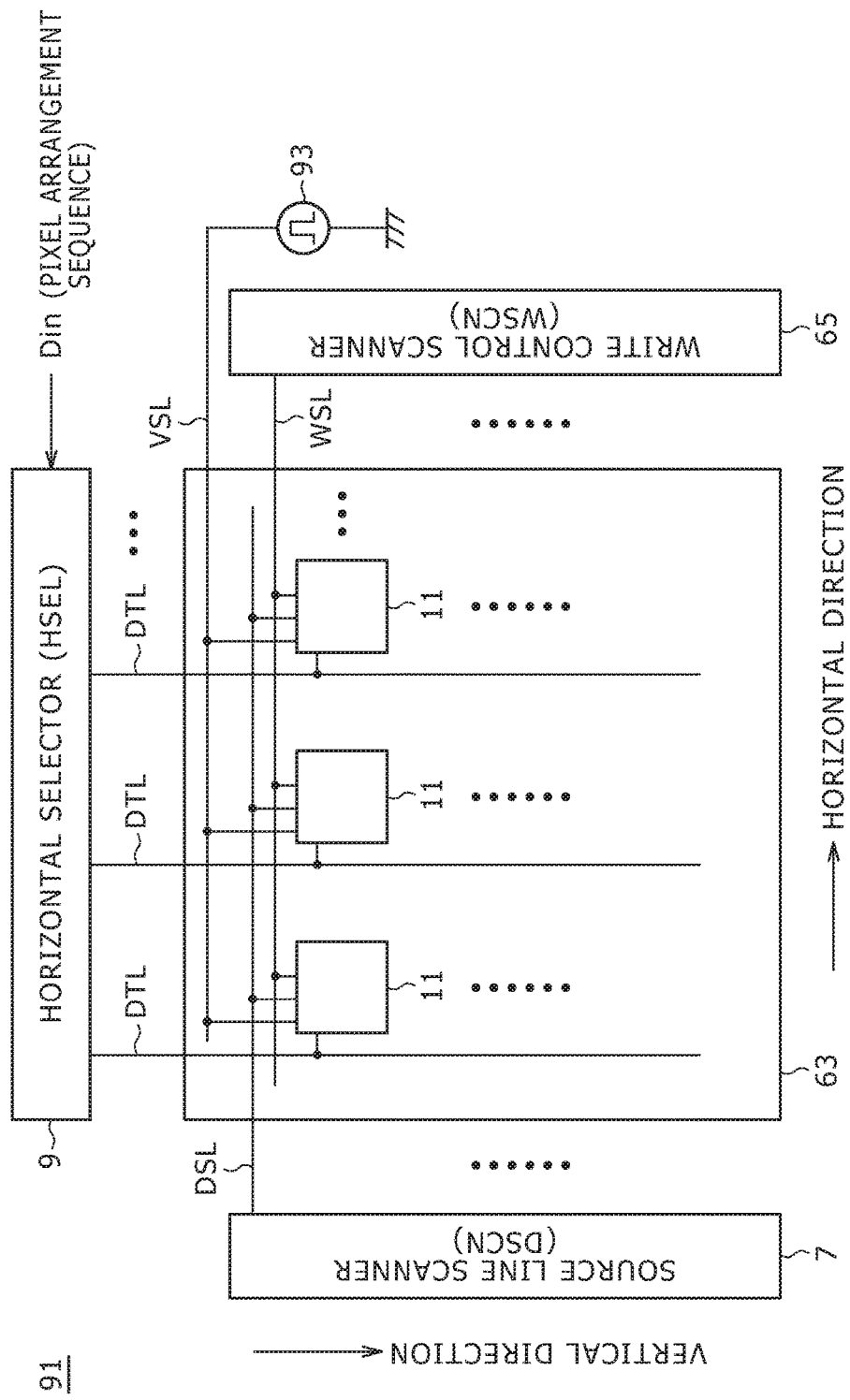
FIG. 22 is a diagram illustrating another power supply system.
Figure 23:
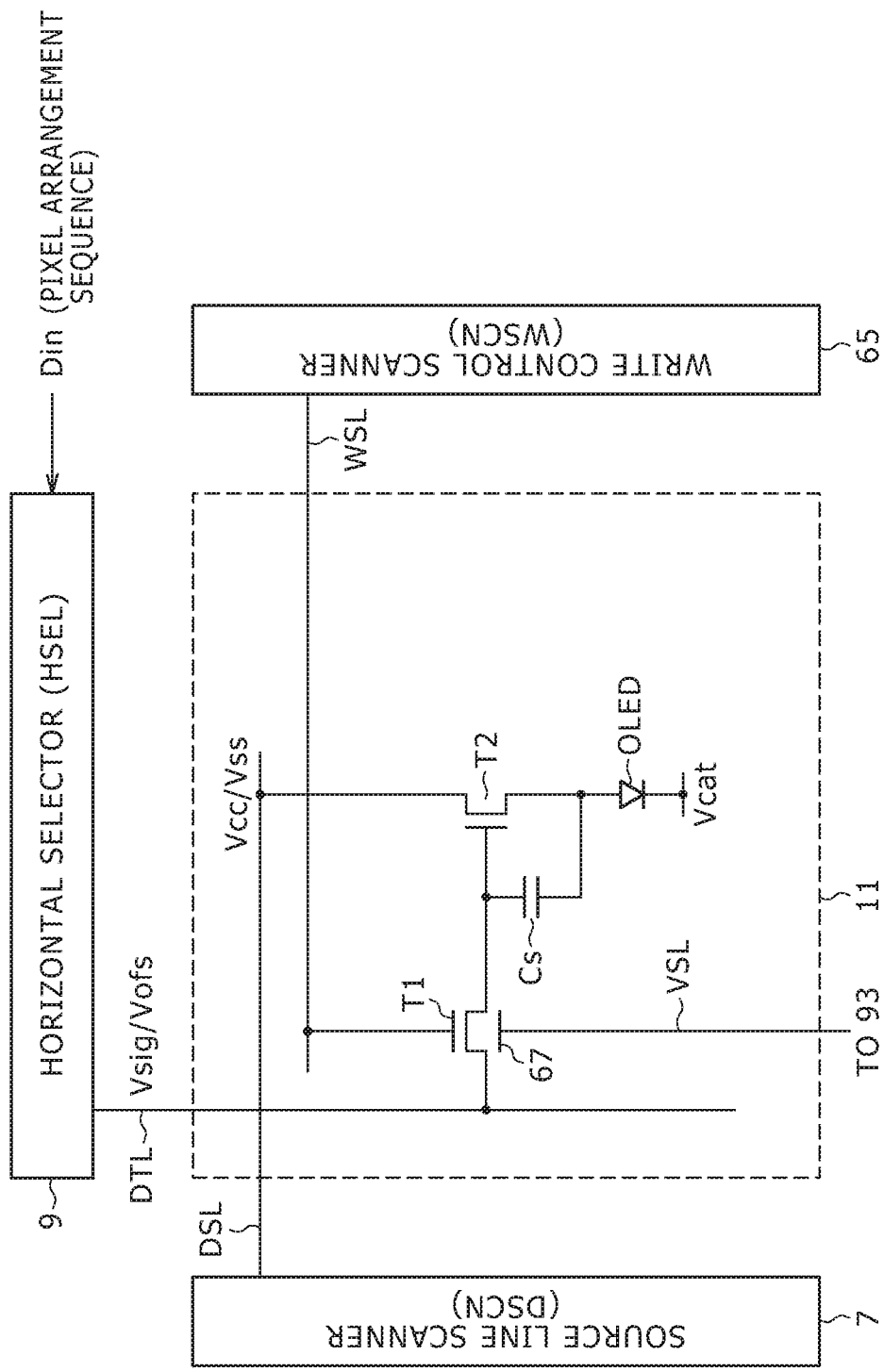
FIG. 23 is a diagram illustrating connection in the pixel circuit.

FIG. 22 shows the structure of the organic EL panel, and FIG. 23 shows the connection in the pixel circuit. In the case of the organic EL panel 91 shown in FIGS. 22 and 23, the light shield pattern 67 is connected to the pulse voltage source 93 through the variable source line VSL. Incidentally, although the pulse voltage source 93 is depicted in FIG. 22 as being connected to all the pixel circuits 11, it may be provided for each horizontal line. The action timing of the pixel circuit 11 may be controlled for each horizontal line.

Needless to say, it is assumed that the potential generated by the pulse voltage source 93 is lower than the cutoff potential which does not turn on the sampling transistor T1 except for the period of on control by the write control line WSL. So long as this condition is met, the driving pulse can be switched at any timing. In this case, too, the potential generated by the pulse voltage source 93 should be set in consideration of change with time of the threshold voltage Vth of the sampling transistor T1, as a matter of course.

Figure 24:
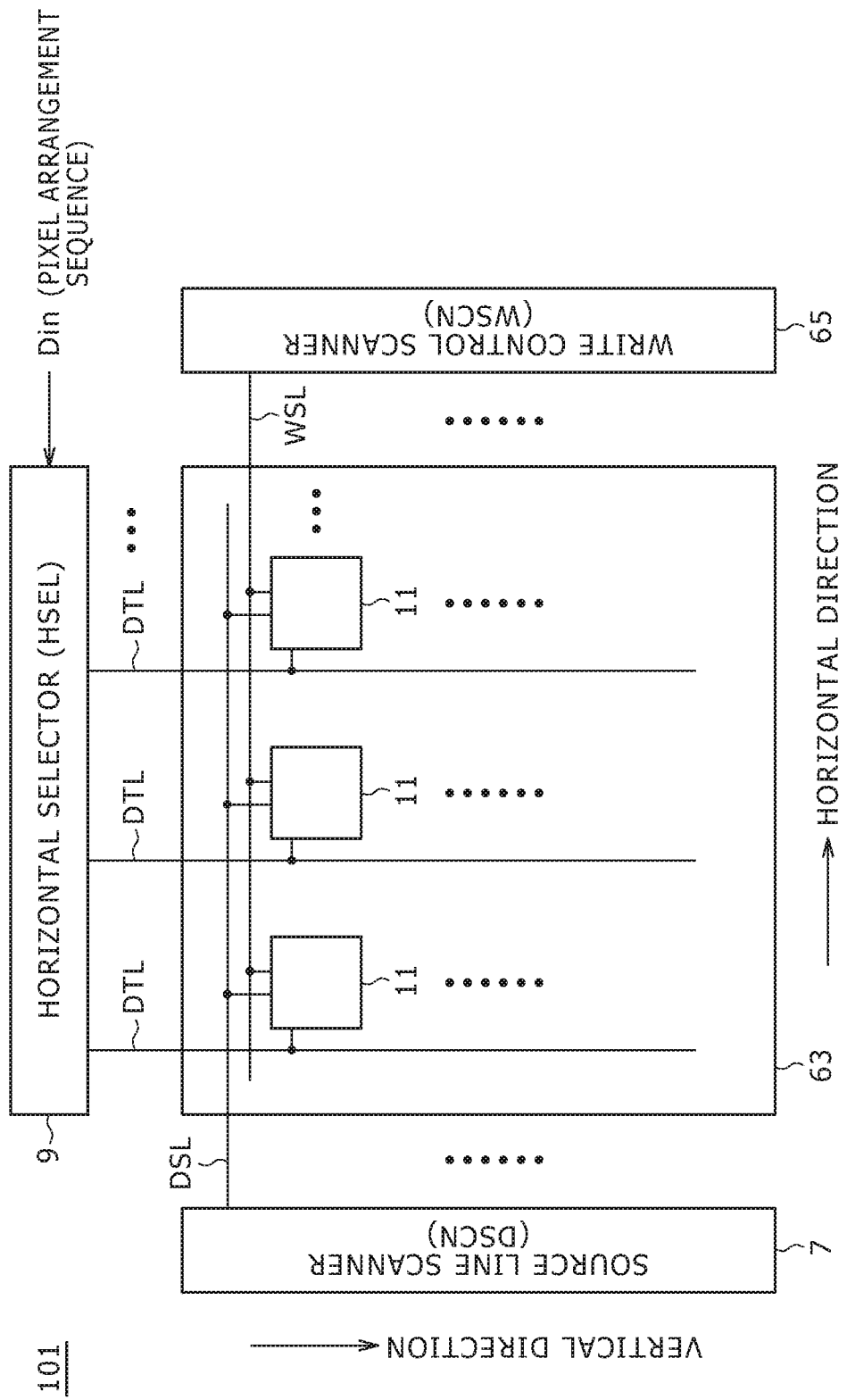
FIG. 24 is a diagram illustrating another power supply system.
Figure 25:
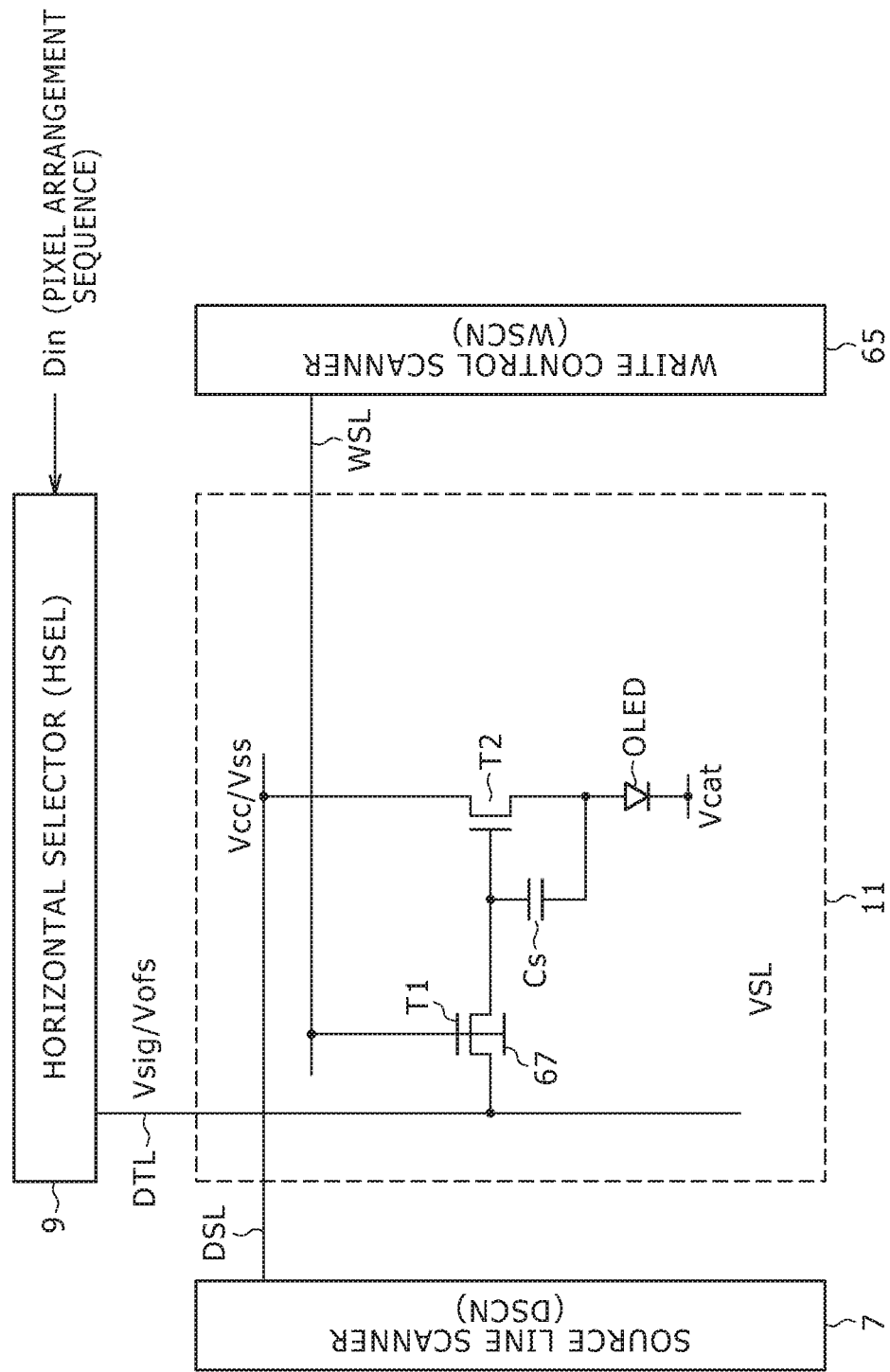
FIG. 25 is a diagram illustrating connection in the pixel circuit.

FIG. 24 shows the structure of the organic EL panel, and FIG. 25 shows the exemplified connection in the pixel circuit. In the case of the organic EL panel 101 shown in FIGS. 24 and 25, the light shield pattern 67 is connected to the write control line WSL. In other words, the sampling transistor T1 constitutes a thin-film transistor of double gate structure. This connection corresponds to the electric supply shown in FIGS. 22 and 23.

(C-2) Material of Light Shield

In the foregoing embodiment, the light shield pattern 67 is made of the same metallic material as the electrode wiring for the thin-film transistor T2. Because of this material, the light shield pattern 67 is expected to reflect all of internally scattered light in the incident direction. However, the light shield pattern 67 may be formed from any metallic material different from the electrode wiring.

Incidentally, even though the light shield pattern 67 cannot reflect all of internally scattered light in the incident direction. It will produce a certain effect so long as it reduces the amount of light passing through it and it reduces the fluctuation of the threshold voltage. For example, the light shield pattern 67 may be formed from a semiconducting material doped with metallic atoms. Alternatively, it may be a black filter or formed from a dark-colored organic material.

(C-3) Other Pixel Circuits

The foregoing embodiment has demonstrated the pixel circuit 11 consisting of two thin-film transistors T1 and T2 and a storage capacitor Cs.

However, the present invention is not concerned with the structure of the pixel circuit 11, and hence it is possible to employ any structure of the pixel circuit 11 and any method for its driving.

The foregoing embodiment has demonstrated the pixel circuit in which the thin-film transistor T1 is of bottom gate type; however, it may be replaced by that of top gate type.

(C-4) Other Panel Structures

The foregoing embodiment has demonstrated the EL display panel of top emission type.

However, the EL display panel may be of bottom emission type, which is constructed such that light is emitted through the circuit substrate.

(C-5) Product Examples

Electronic Apparatus

In the foregoing, the description has been made with reference to the organic EL panel. The organic EL panel mentioned above is mounted on a variety of electronic apparatus as exemplified below.

Figure 26:
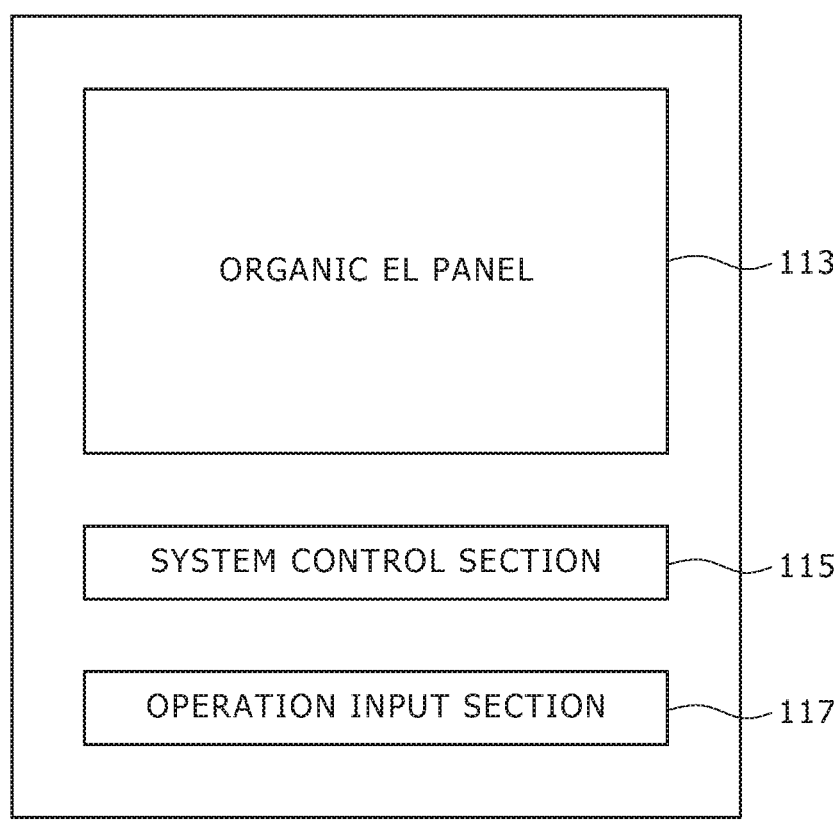
FIG. 26 is a conceptual diagram illustrating the structure of the electronic apparatus.

FIG. 26 shows a concept of the structure of the electronic apparatus 111. The electronic apparatus 111 consists of the organic EL panel 113 mentioned above, the system control section 115, and the operation input section 117. The system control section 115 performs various processes according to the type of the electronic apparatus 111. The operation input section 117 is a device to accept operation input for the system control section 115. The operation input section 117 includes mechanical interfaces (such as switches and buttons) and graphical interfaces.

Incidentally, the electronic apparatus 111 is not specifically restricted in its application area so long as it has a function to display images or videos generated therein or entered from outside.

Figure 27:
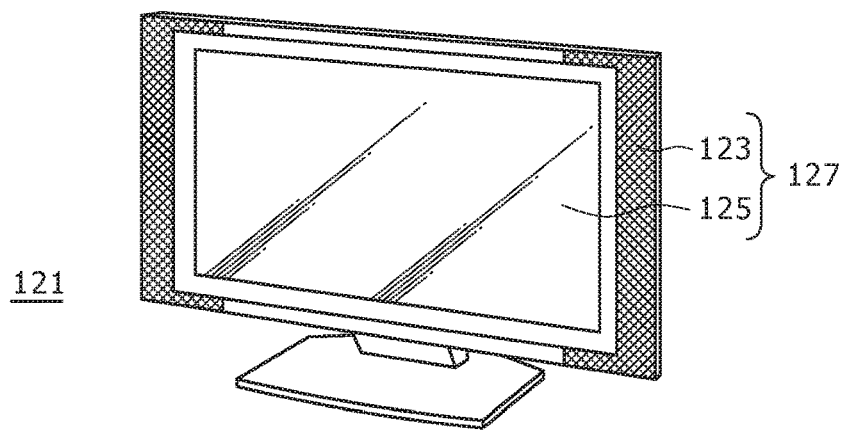
FIG. 27 is a diagram illustrating a commercial electronic apparatus.

FIG. 27 shows an appearance of the electronic apparatus as a television set. The television set 121 has a display screen 127 (consisting of a front panel 123 and a filter glass 125) fitted on the front face of the casing thereof. The display screen 127 corresponds to the organic EL panel explained in the embodiment.

Figure 28A:
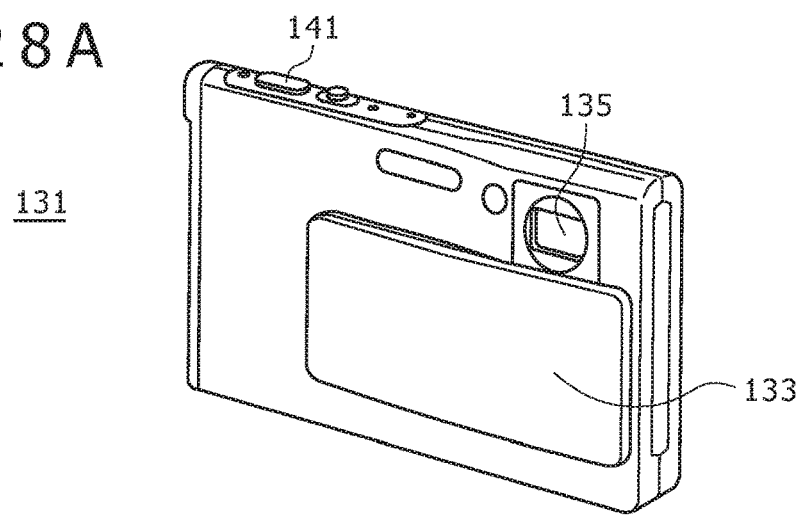
FIGS. 28A and 28B are diagrams illustrating a commercial electronic apparatus.
Figure 28B:
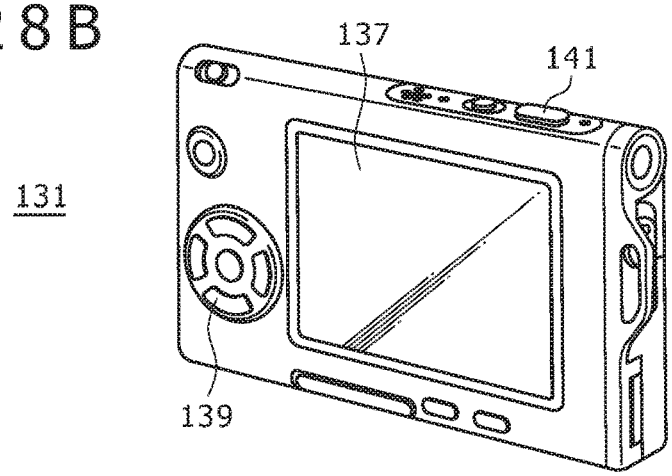

The electronic apparatus 111 includes the digital camera 131 whose appearance is shown in FIGS. 28A and 28B. FIG. 28A is an exemplified front view (facing the object) and FIG. 28B is an exemplified rear view (facing the photographer).

The digital camera 131 consists of a protective cover 133, an image pickup lens 135, a display screen 137, a control switch 139, and a shutter button 141. The display screen 137 corresponds to the organic EL panel explained in the embodiment.

Figure 29:
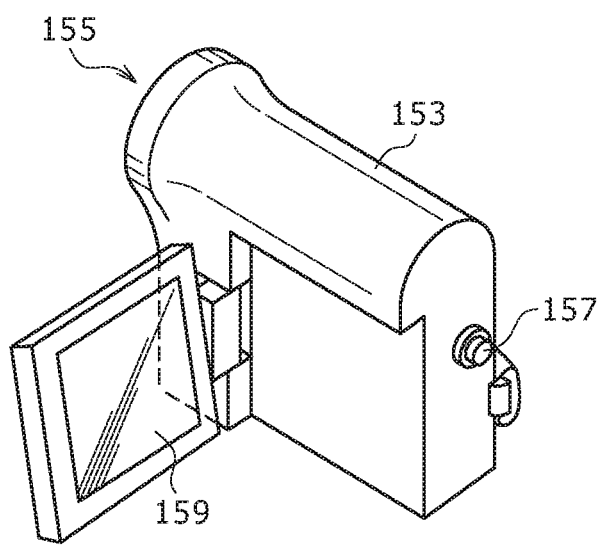
FIG. 29 is a diagram illustrating a commercial electronic apparatus.

The electronic apparatus 111 includes the video camera 151 whose appearance is shown in FIG. 29.

The video camera 151 consists of a main body 153, an image pickup lens 155 attached to the front of the main body 153, a start/stop switch 157, and a display screen 159. The display screen 159 corresponds to the organic EL panel explained in the embodiment.

Figure 30A:
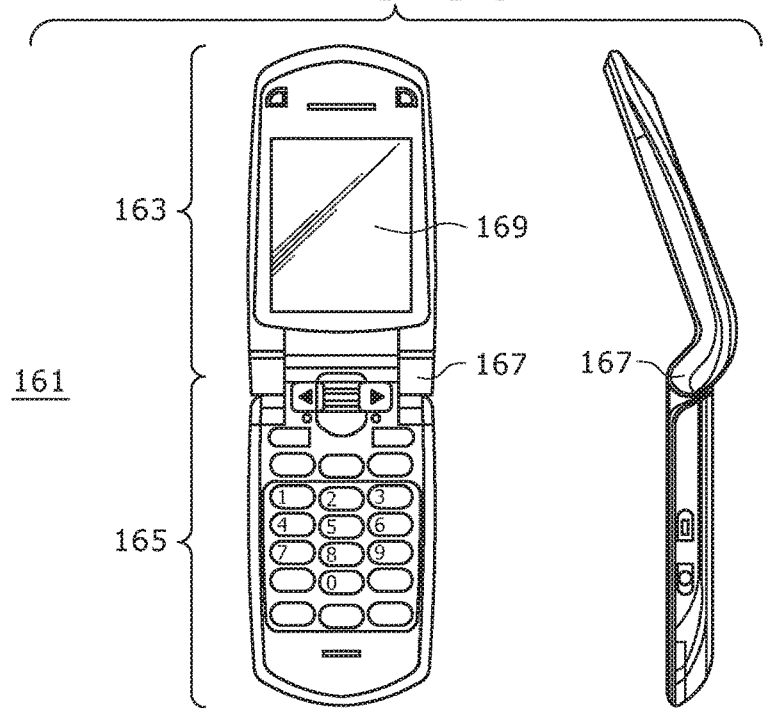
FIGS. 30A and 30B are diagrams illustrating a commercial electronic apparatus.
Figure 30B:
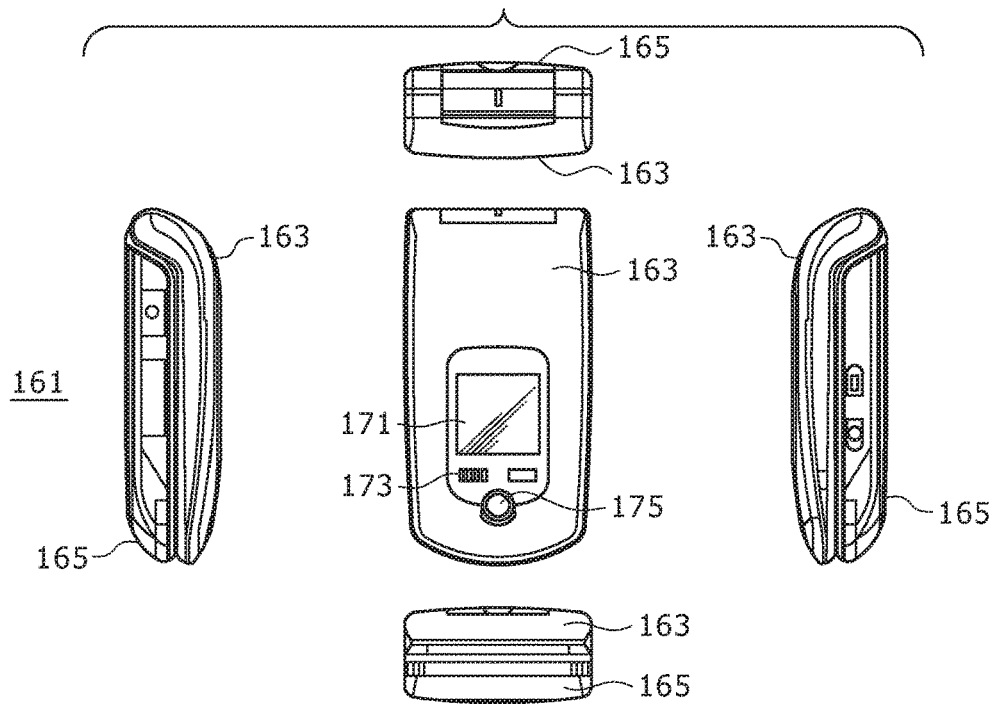

The electronic apparatus 111 includes a mobile terminal, for example. The appearance of a mobile phone 161 as a portable remote terminal is shown in FIGS. 30A and 30B. The mobile phone 161 shown in FIGS. 30A and 30B is a collapsible one. FIG. 30A is an external appearance, with the casing opened, and FIG. 30B is an external appearance, with the casing closed.

The mobile phone 161 consists of an upper casing 163, a lower casing 165, a hinge 167 as a connector, a display screen 169, an auxiliary display screen 171, a picture light 173, and an image pickup lens 175. The display screen 169 and the auxiliary display screen 171 correspond to the organic EL panel explained in the embodiment.

Figure 31:
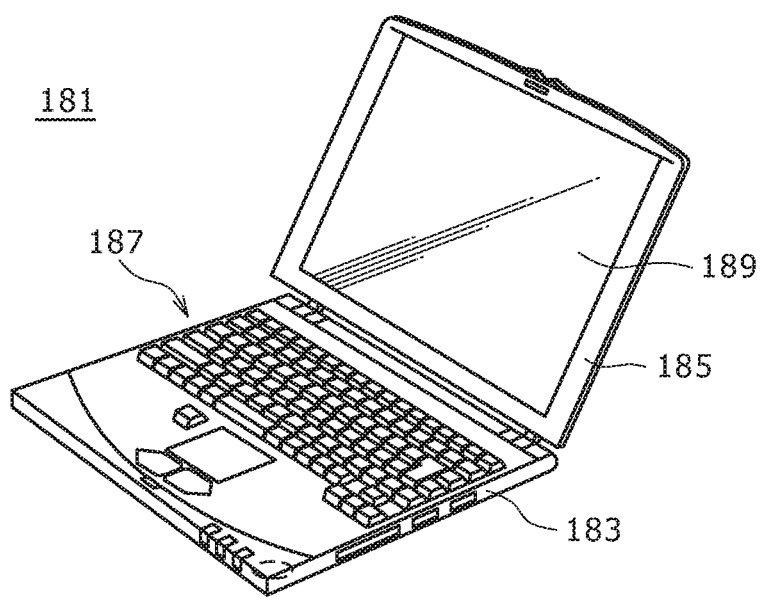
FIG. 31 is a diagram illustrating a commercial electronic apparatus.

The electronic apparatus 111 includes a computer, for example. The appearance of a notebook computer 181 as a computer is shown in FIG. 31. The notebook computer 181 consists of a lower casing 183, an upper casing 185, a keyboard 187, and a display screen 189. The display screen 189 corresponds to the organic EL panel explained in the embodiment.

In addition, the electronic apparatus 111 includes audio players, game machines, electronic books, and electronic dictionaries.

(C-6) Other Example of Display Device

The foregoing embodiment has demonstrated the application of the present invention to the organic EL panel. However, the driving technique mentioned above can also be applied to other EL display devices, such as display devices with LEDs or light-emitting elements of diode structure, which include inorganic EL panels.

(C-7) Others

The forgoing embodiment may be variously modified within the scope of the present invention, by combining or changing the examples described in this specification.

While a preferred embodiment of the present invention has been described using specific terms, such description is for illustrative purposes only, and it is to be understood that changes and variations may be made without departing from the spirit or scope of the following claims.

What is claimed is:

1. A display panel comprising;
   (i) a substrate,
   (ii) a stacked structure disposed on the substrate, the stacked structure including, in this order:
      (ii-a) a first molybdenum layer,
      (ii-b) a first insulating layer,
      (ii-c) a polysilicon layer to form a source/drain region and a channel region of a sampling transistor,
      (ii-d) a second insulating layer,
      (ii-e) a second molybdenum layer electrically connected directly to the first molybdenum layer to form a gate electrode of the sampling transistor, and
      (ii-f) a third insulating layer,
   (iii) a light-emitting element disposed on the stacked structure, the light-emitting element including:
      (iii-a) a metallic anode electrode disposed on the third insulating layer,
      (iii-b) an organic layer disposed on the metallic anode electrode, and
      (iii-c) a transparent cathode electrode disposed on the organic layer,
   wherein a gate electrode of a driving transistor is electrically connected to the polysilicon layer and a first electrode of a storage capacitor, and
   a second electrode of the storage capacitor is electrically connected directly to the metallic anode electrode and is electrically connected directly to a source/drain region of the driving transistor.

2. The display panel according to claim 1, wherein the second molybdenum layer is a light shielding layer.

* * * * *